US009400314B2

(12) United States Patent
Humphrey et al.

(10) Patent No.: US 9,400,314 B2
(45) Date of Patent: Jul. 26, 2016

(54) EXTENDED SYSTEMS AND METHODS FOR TESTING POWER SUPPLIES

(75) Inventors: Clark Humphrey, Fort Worth, TX (US); Jimmie Paul Partee, Double Oak, TX (US); Martin Bronsard, Montreal (CA); Mateusz Jecz, Montreal (CA); Robert F. Straker, Vaudreuil-Dorion (CA)

(73) Assignee: ATC Logistics & Electronics, Inc., Fort Worth, TX (US)

(*) Notice: Subject to any disclaimer, the term of this patent is extended or adjusted under 35 U.S.C. 154(b) by 957 days.

(21) Appl. No.: 13/592,643

(22) Filed: Aug. 23, 2012

(65) Prior Publication Data

US 2013/0049794 A1 Feb. 28, 2013

Related U.S. Application Data

(63) Continuation-in-part of application No. 12/761,003, filed on Apr. 15, 2010, now Pat. No. 8,988,098, and a continuation-in-part of application No. 13/434,275, filed on Mar. 29, 2012.

(51) Int. Cl.
*G01R 31/40* (2014.01)

(52) U.S. Cl.
CPC ...................... *G01R 31/40* (2013.01)

(58) Field of Classification Search
CPC ........................................... G01R 21/06
USPC .................... 324/764.01, 426–437, 439–450, 324/762.01; 702/57–80; 320/137–167
See application file for complete search history.

(56) References Cited

U.S. PATENT DOCUMENTS

| 4,329,643 A | * | 5/1982 | Neumann | G08B 29/14 324/750.3 |
|---|---|---|---|---|
| 4,357,574 A | | 11/1982 | Takamisawa et al. | |
| 4,992,739 A | * | 2/1991 | Kosch | G01R 31/026 324/540 |
| 6,239,579 B1 | | 5/2001 | Dunn et al. | |
| 6,351,130 B1 | | 2/2002 | Preiser et al. | |
| 6,441,584 B1 | * | 8/2002 | Crass | 320/131 |
| 6,639,409 B2 | | 10/2003 | Morimoto et al. | |
| 6,992,487 B1 | | 1/2006 | Steinke | |
| 7,112,988 B2 | | 9/2006 | Xiao | |
| 7,173,428 B2 | | 2/2007 | Hurwicz | |

(Continued)

OTHER PUBLICATIONS

Jim McBride, "Charger test technique employs power-supply current sinking capability," http://www.tmworld.com/article/325575-Power supply simulates battery.php, Test & Measurement World, Dec. 1, 2001.

(Continued)

*Primary Examiner* — Jermele M Hollington
*Assistant Examiner* — Giovanni Astacio-Oquendo
(74) *Attorney, Agent, or Firm* — McGuireWoods LLP

(57) ABSTRACT

A system and method for testing multiple power supplies. Multiple power supplies are received including a power-end and an adapter end for connection to a power supply tester. Programmable loads and test parameters are configured for the power supply tester in response to a user selection. The multiple power supplies are automatically tested utilizing the test parameters. Performance characteristics of the multiple power supplies are measured during testing. The performance characteristics of the multiple power supplies are recorded. Results indicating whether each of the multiple power supplies passed the testing are displayed utilizing one or more displays and light emitting diodes.

26 Claims, 16 Drawing Sheets

(56) References Cited

U.S. PATENT DOCUMENTS

| | | | |
|---|---|---|---|
| 7,245,119 | B2 | 7/2007 | Ivannikov et al. |
| 7,392,147 | B2 | 6/2008 | Lo et al. |
| 7,436,200 | B1 | 10/2008 | Jacobsen et al. |
| 7,570,073 | B2 | 8/2009 | Xiao et al. |
| 7,737,715 | B2 * | 6/2010 | Tilbor ................ G01R 31/2889 324/762.02 |
| 7,821,234 | B2 * | 10/2010 | Moriya ......................... 320/134 |
| 8,405,398 | B2 * | 3/2013 | Burkes ................ G06F 17/5036 320/106 |
| 8,498,830 | B2 | 7/2013 | Landry et al. |
| 8,547,131 | B2 | 10/2013 | Wang et al. |
| 8,589,110 | B2 * | 11/2013 | Liu et al. ....................... 702/118 |
| 8,648,609 | B2 * | 2/2014 | Shi ........................... H04N 17/04 324/555 |
| 2003/0088376 | A1 * | 5/2003 | Zimmerman ...... G01R 31/3631 702/63 |
| 2003/0178968 | A1 | 9/2003 | Sakakibara et al. |
| 2003/0184306 | A1 | 10/2003 | Bertness et al. |
| 2003/0188206 | A1 | 10/2003 | Odaohhara |
| 2008/0061797 | A1 | 3/2008 | Xiao et al. |
| 2008/0122477 | A1 | 5/2008 | Yuan et al. |
| 2008/0129123 | A1 | 6/2008 | Jia |
| 2008/0164762 | A1 | 7/2008 | Pecile |
| 2008/0270079 | A1 * | 10/2008 | Delory .......................... 702/186 |
| 2009/0058454 | A1 * | 3/2009 | An et al. ....................... 324/765 |
| 2009/0261843 | A1 | 10/2009 | Li |
| 2010/0007370 | A1 | 1/2010 | Dishman et al. |
| 2012/0182039 | A1 | 7/2012 | Partee |
| 2012/0185201 | A1 * | 7/2012 | Chen ..................... G01R 31/40 702/118 |

OTHER PUBLICATIONS

Saab et al, "Battery Emulation Circuit Speeds," http://powerelectronics.com/ portable power management/battery charger ics/805PET20battery-charger-testing.pdf, May 2008.

Geiper Search Report dated Feb. 10, 2010.

* cited by examiner

EXTENDED SYSTEMS AND METHODS FOR TESTING POWER SUPPLIES

CROSS REFERENCE TO RELATED APPLICATIONS

This application is a Continuation-In-Part of U.S. patent application Ser. No. 12/761,003 filed on Apr. 15, 2010 entitled SYSTEMS AND METHODS FOR MODULAR TESTING OF CHARGERS and U.S. patent application Ser. No. 13/434,275 filed on 12 Mar. 2012 entitled SYSTEMS AND METHOD FOR TESTING POWER SUPPLIES the entire teachings of which are incorporated herein.

BACKGROUND

The use of and development of electronics equipment has grown nearly exponentially in recent years. The growth is fueled by better electronics hardware and software available to organizations and consumers and the increased appetite for mobile devices. In particular, electronic and mobile devices, such as cell phones, set-top boxes, residential gateways, streaming devices, media players, medical equipment, and other similar electronic devices are being released nearly constantly. Electronic devices typically require a power supply or charger that is utilized to power and/or charge the electronic device by converting electrical energy passing through the power supply into chemical or potential utilized by the electronic device and energy stored by the battery, if present.

Millions of electronic devices and their respective power supplies are returned, refurbished, fixed, or otherwise processed each year. Testing power supplies and chargers may be difficult because of the number of devices to be processed, varying interfaces and ports, load compatibility, and functional and non-functional characteristics (i.e., voltage and current). As a result, in many cases re-processed power supplies and chargers are discarded increasing environmental and manufacturing waste.

SUMMARY

One embodiment provides a system and method for testing multiple power supplies. Multiple power supplies may be received including a power-end and an adapter end for connection to a power supply tester. Programmable loads and test parameters may be configured for the power supply tester in response to a user selection. The multiple power supplies may be automatically tested utilizing the test parameters. Performance characteristics of the multiple power supplies may be measured during testing. The performance characteristics of the multiple power supplies are recorded. Results indicating whether each of the multiple power supplies passed the testing may be displayed utilizing one or more displays and light emitting diodes.

Another embodiment provides a power supply tester. The power supply tester may include multiple testing modules for testing ten power supplies. The multiple testing modules may each include a set of ports for receiving an adapter-end of each of the multiple power supplies, a port in communication with the set of ports through one of a plurality of testing circuits, and LEDs indicating whether each of the multiple power supplies passed or failed the testing. The port may be operable to receive a power-end of each of the power supplies for providing an alternating current (AC) signal to each of the multiple power supplies. The multiple testing circuits may include a programmable load. The power supply tester may further include a programmable power supply for providing the AC signal for the multiple power supplies being tested. The power supply tester may further include one or more measurement devices for measuring performance information through the multiple test circuits during testing of each of multiple power supplies. The power supply tester may further include a display for displaying the performance information to a user indicating whether each of the multiple power supplies passed or failed the testing.

Yet another embodiment provides a power supply tester. The power supply tester may include multiple testing modules for testing multiple power supplies. The multiple testing modules may be integrated with hinged extensions of the power supply tester. The multiple testing modules may include a set of ports for receiving an adapter-end of each of the multiple power supplies, a port in communication with the set of ports through one of multiple testing circuits, and LEDs indicating whether each of the multiple power supplies passed or failed the testing. The port may be operable to receive a power-end of the plurality of power supplies for providing an alternating current (AC) signal to each of the multiple power supplies. Each of the multiple testing circuits may include a programmable load. The power supply tester may further include a programmable power supply for providing the AC signal for the multiple power supplies being tested. The power supply tester may further include one or more measurement devices for measuring performance information through the multiple test circuits during testing of each of the multiple power supplies. The power supply tester may further include a database for storing the performance information associated with each of the multiple power supplies. The power supply tester may further include a display for displaying the performance information to a user indicating whether each of the plurality of power supplies passed or failed the testing.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

Illustrative embodiments provide a modular system for testing power supplies and chargers. The term power supply is utilized to generically refer to power supplies, chargers, adapters, wireless devices, gaming systems, music players, appliances, or other electronic devices, systems, or equipment. The power supplies may also be referred to as units under test (UUT) or charger interchangeably. In one embodiment, a power supply may be tested utilizing a power supply tester or charger tester to determine functionality or nonfunctionality of the power supply for use with one or more electronic devices. The power supply tester is a device that may be utilized by a user to determine functionality or performance characteristics of a power supply. Functionality may be determined based on pre-set criteria or based on the performance characteristics of the power supply as measured during simulated operational conditions. Performance characteristics may include current, voltage, impedance, temperature, and other similar electrical characteristics of the power supply as measured when a load module is modularly connected to the power supply tester.

Figure 1A:
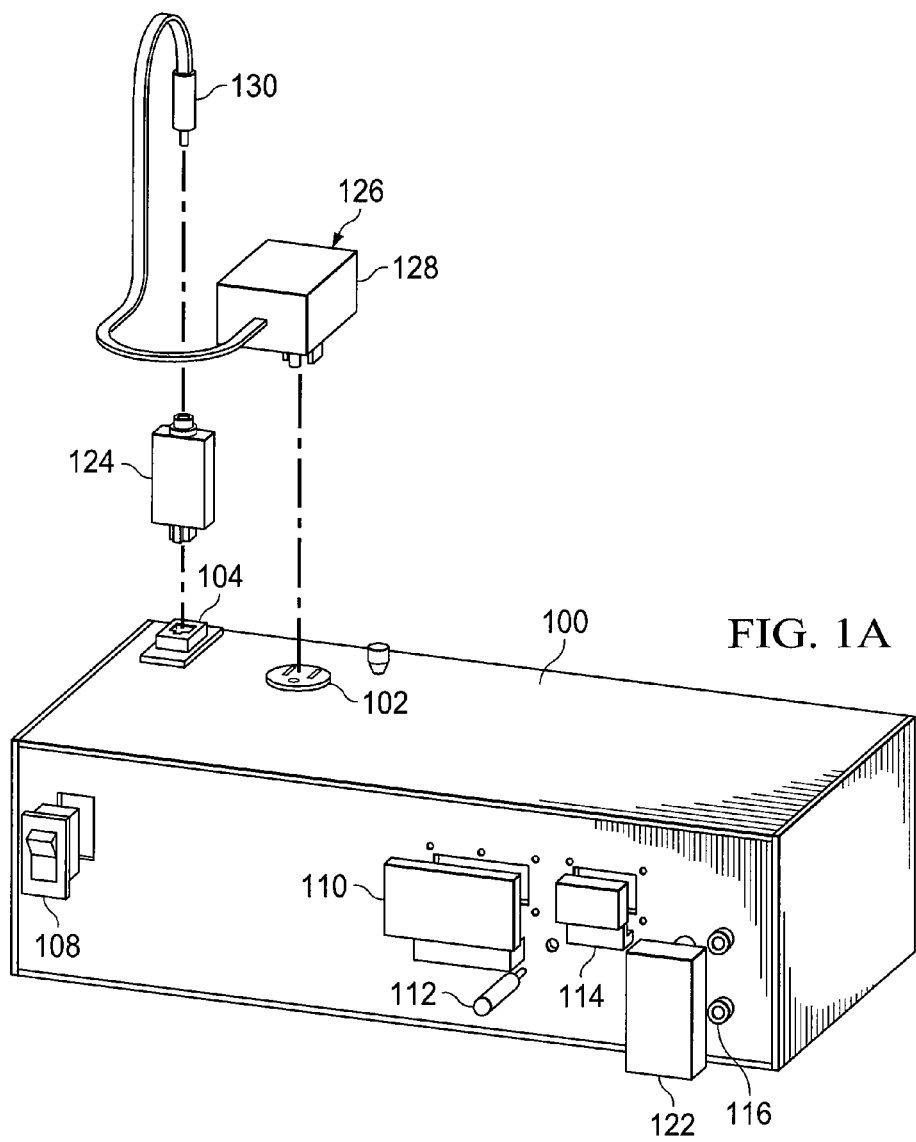
FIG. 1A is a pictorial representation of a front view of a power supply tester in accordance with an illustrative embodiment.
Figure 1B:
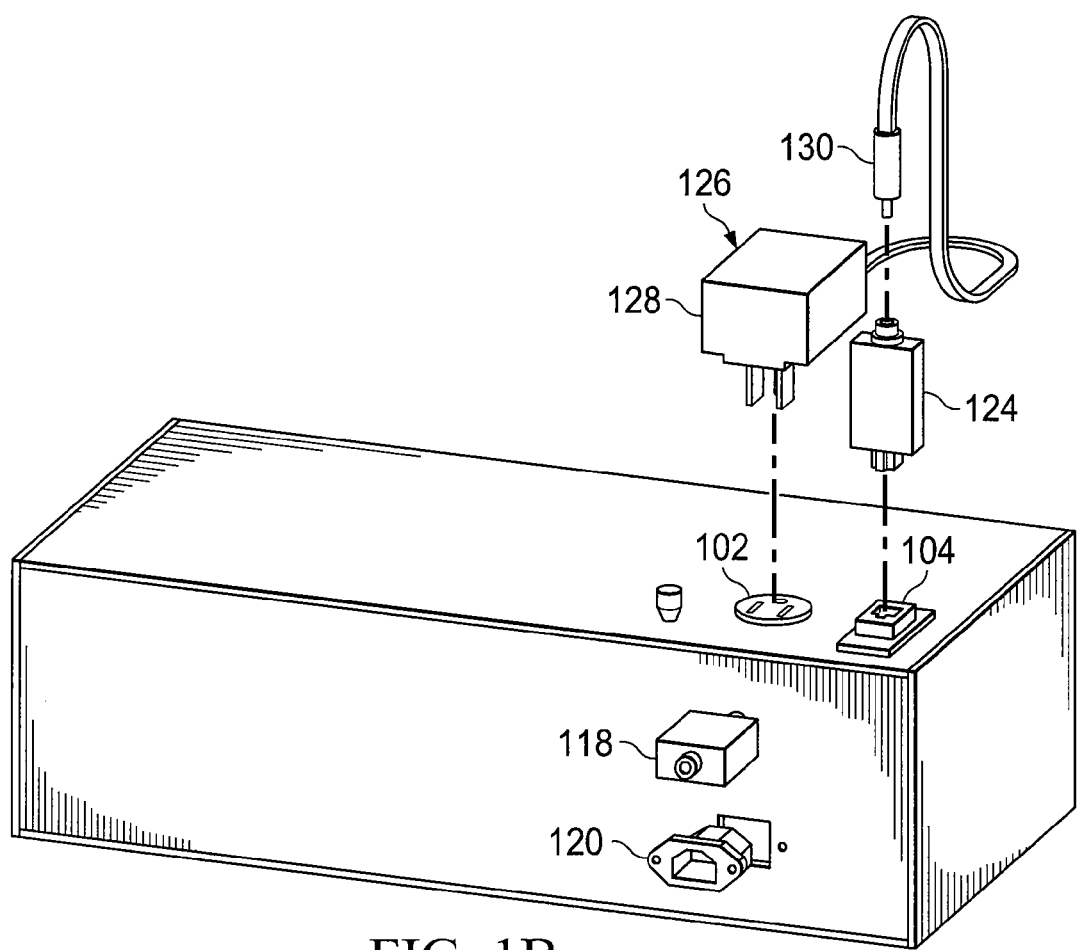
FIG. 1B is a pictorial representation of a rear-view of a power supply tester in accordance with an illustrative embodiment.

The power supply tester may temporarily power the power supply during testing. An adapter module may be connected to the power supply tester for receiving an adapter-end of the power supply. In another embodiment, the adapter-end may also be connected directly to the power supply tester. The adapter module may be selected based on the power supply type, battery-powered device for which the power supply is utilized (which may include make and model), and other manually or automatically determined information. Similarly, a load or load module may be manually or dynamically applied to the power supply by the power supply tester to simulate a standard, maximum, or customized load that may be utilized by the power supply during operation to determine the performance characteristics. The power supply tester may include a number of safety measures including relays, switches, and timers utilized to ensure the safety of the user and continued operation of the power supply and power supply tester during and after testing of the power supply. In one embodiment, the power supply may be tested alone or along with the corresponding device Referring now to FIGS. 1A-B, one embodiment of a charger tester 100 is illustrated. The charger tester 100 may include any number of components, elements, and configurations. In one embodiment, the charger tester 100 may include an AC test outlet 102, an adapter port 104, a power switch 108, a volt meter 110, a power indicator 112, an ammeter 114, a load port 116, a circuit breaker 118, an AC power inlet 120, a load module 122, an adapter module 124, a charger 126, a power-end 128, and an adapter-end 130.

The charger tester 100 may be modularly configured to test mobile charging devices, such as the charger 126. Typically the charger 126 may be utilized to charge a battery or other energy storage device or to temporarily power an electronic device. For example, the charger 126 may be utilized to charge a cell phone battery. In another embodiment, the charger 126 may be a power plug (e.g. power brick), AC adapter, connector, or power plug for powering or charging any electronic device. For example, the electronic device may be solely powered by the charger 126. The charger tester 100 may be modularly configured to test the charger 126. For instance, the adapter module 124 and the load module 122 may be selected specifically for testing the charger 326. The modular connection of the adapter module 124 and load module 122 provides flexibility for efficiently testing a number of different charger types for reuse rather than discarding or recycling the chargers based on an unknown condition.

The adapter module 124 is an adapter for interfacing the adapter-end 328 of the charger 126 with the charger tester 100 through a port. The adapter module 124 may be adapted to receive the adapter-end 130 of the charger 126. The adapter-end 130 may be a standardized interface, such as those promulgated by a standards body or other technical or industry source, or a proprietary interface, such as those used by numerous electronic device manufacturers. In one embodiment, the adapter-end 130 may represent a mini or micro USB. In particular, the adapter module 124 is configured to connect to the adapter port 104 so that a load and measurements may be made as if the charger 126 was actually powering or charging an electronic device.

The adapter module 124 may be configured to be received by the adapter port 104. In one embodiment, the adapter port 104 is an RJ45 jack/port configured to receive an RJ45 head integrated with the adapter module 124. For example, the adapter port 104 may be a stainless steel port configured for long term repeated use without damaging the adapter port 104 when receiving adapter modules. The adapter port 104 and associated connector of the adapter module 124 may utilize any number of adapter combinations suitable for frequent and extensive testing. In another embodiment, the adapter module 124 may be integrated with the charger tester 100, but may be removed as necessary for testing distinct chargers. The adapter module 124 is further described in FIGS. 4A-B. In one embodiment, the insertion of the adapter-end 130 of the adapter module 124 may activate power through the charger 126 in response to pins 3 and 6 of the adapter module 124 making contact. Contact of the pins at the adapter-end or plugs of the power-end of the charger 126 may be utilized to automatically initiate testing including providing an AC power signal to the charger. In one embodiment, relays may be utilized to implement testing for one or more chargers in response to connection of the charger 126 to the charger tester 100. In another embodiment, one or more of the adapter modules may be an integrated part of the charger tester 100.

The load module 122 is a resistive load that is connectable to the charger 126. The load module 122 may provide a resistive load that simulates the load required to charge or power the mobile device associated with the charger 126. The load module 122 may also be configured to simulate completely emptied batteries, complex impedance and resistance characteristics, and other conditions that the charger 326 may experience in real world environments. In another embodiment, the load module 122 may provide information that may be read by the charger tester 100 to configure a dynamic or programmable load. The load module 122 may provide a physical way for the user to verify the load being applied to the charger 126.

In one embodiment, the load module 122 may be configured to supply +/−10% of the rated load. The rated load may be provided based on original equipment manufacturers (OEM) guidelines or specifications for the associated mobile device. The adapter module 124 and load module 122 are modular and may be easily changed out to test alternative electronic devices providing a user or technician maximum efficiency to test a number of chargers. The load module 122 may be connected to the load port 116 of the charger tester 100. The load module 122 is further described in FIGS. 5A-B. The rated load may also be varied based on the selected load module to test the charger 126 during extreme operating conditions.

For example, the load module 122 may include a D-subminiature electrical connector, such as DB-9 or DE-9 male connector or plug. The load port 116 may likewise be a DB-9 or DE-9 female connector or socket. In one embodiment, the load module 122 may include digital logic, such as a programmable digital-to-analog converter (DAC), that is electronically read by a processor or logic of the charger tester 100 to programmably set the load that is applied to the charger 126. For example, the value stored in the programmable DAC may include a value that is directly or indirectly converted to an amperage applied by the charger tester 100 to the charger 126. In one embodiment, the charger tester 100 may be configured to apply an amperage up to 3 amps. However, the current may be greater for testing electronic devices with more intense power requirements. The charger tester 100 may be configured to execute a program or logic to interpret the values of the load module 122 to test the charger 126. For example, an operator or administrator may program a number of load modules for testing specific chargers. The load modules may be labeled utilizing fixed label, erasable label, or digital read/out (e.g. a miniature display). As a result, the user may physically select and insert the load module 122 providing a more physical interaction for performing the testing.

The load module 122 and the adapter module 124 may include plastic housings with ergonomics that allow the easy insertion or removal from the charger tester 100. The electrical components of the load module 122 and the adapter module 124 including pins, traces, wires, paths, resistors, circuitry, logic, and other elements may be similarly protected by the housings.

The load port 116 provides a universal configuration for receiving any number of load modules. In one embodiment, the load port 116 may be configured to receive banana jacks. However, the load port 116 may be used to receive any load module 122 suited for electronically connecting a resistance or impedance to the charger 126 that approximates or simulates operation of the charger 126 when charging or powering the mobile device. The load port 116 may be configured to receive two or more connectors that are part of the load module 122 for applying the load to the device. The load port 116 provides flexibility for applying different load modules with different requirements.

The charger 126 is powered through the AC test outlet 102 in response to the adapter module 124 being inserted into the adapter port 104. The AC test outlet 102 is a power outlet configured to power the charger 126 at the designated voltage and current. In one embodiment, the charger tester 100 may include various test outlets or power ports for powering the charger 126 at different voltages or in order to interface with different power adapters. For example, the charger tester 100 may be configured to interface with European devices that may have different voltage and connect requirements and standards. Similarly, the charger tester 100 may include alternative power ports for testing vehicular charging devices, such as an interface for a power port or cigarette lighter of a vehicle. Alternatively, a USB powered port or other alternative powers ports may be provided as well. In one embodiment, the charger tester 100 may utilize multiple test outlets, load and adapter, ports, adapter ports, load ports, various test outlets, power ports, and other components of the charger tester 100 to test multiple devices, simultaneously, serially, or concurrently. For example, a dynamic load of the charger tester 100 may be configured to test multiple chargers of the same type in batches. In another embodiment, distinct charger types may be tested utilizing information, identifiers, testing procedures, parameters, and measurements that are distinct.

The volt meter 110 measures the voltage across the charger 126 while being tested. The ammeter 114 similarly measures the current through the charger 126 during testing. In one embodiment, the volt meter 110 and ammeter 114 include a digital display that indicate on an exterior portion of the charger tester 100 the applicable voltage and current measured by the charger tester 100. The digital display may also indicate whether the charger 126 has passed or failed the applicable test based on manually or automatically determined criteria, tolerances, or thresholds. The volt meter 110 and ammeter 114 may measure and display any number of configured test results including spikes, averages, or other specific tests. The volt meter 110 and ammeter 114 may include multiple components for measuring the performance of multiple chargers simultaneously. The measurements may also be stored in a database during continuous or repeated measurements.

The AC power inlet 120 provides power to the charger tester 100 and indirectly to the AC test outlet 102. The circuit breaker 118 is an automatically-operated electrical switch that protects the charger tester 100 and charger 126 under test from damage caused by overload or a short circuit. The circuit breaker 118 discontinues electrical flow in the event of excessive AC input current to the charger 126 (including primary or secondary windings), short circuit, or failure of the load module 122.

The power switch 108 is an electrical switch for electrically activating the charger tester 100. The power switch 108 provides a manual switch for activating or deactivating the charger tester 100. The power indicator 112 may be utilized to indicate that the charger tester 100 is performing testing of the charger 126. Alternatively, the power indicator 112 may also indicate when the charger tester 100 is plugged in through the AC power inlet 120 and/or when the power switch 108 has been activated. For example, the power switch 108 may power on the AC test outlet 102 in response to receiving the adapter module 124 in the adapter port 104 or in response to receiving either end of the charger 126.

As shown, the charger tester 100 may be encompassed by plates, panels, or one or more frames that house the circuits, ports, indicators, and other elements of the charger tester. The charger tester 100 may take any number of shapes and configurations. In another embodiment, the charger tester 100 may include a display that indicates the current, voltage, load, and internal temperatures of the charger. In response to some of the tests, the test conditions may vary and the displays of the charger tester 100 may display the applied parameters as well as the measured parameters.

Figure 2:
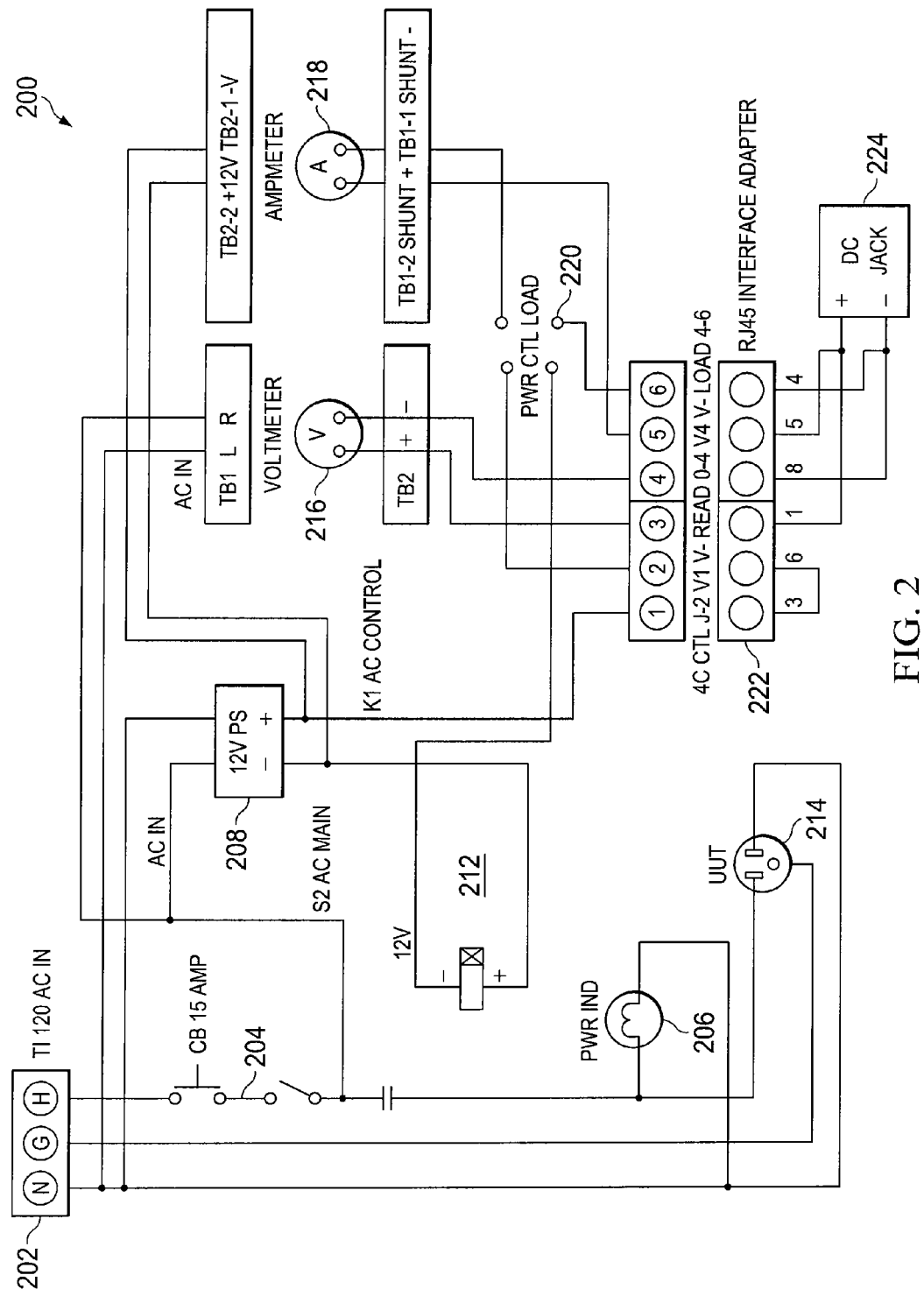
FIG. 2 is a circuit schematic representation of the power supply tester in accordance with an illustrative embodiment.

Referring now to FIG. 2, a circuit schematic representation of the charger tester is illustrated. FIG. 2 provides one embodiment of a charger tester circuit 200 that may be part of a charger tester, such as charger tester 100 of FIG. 1. In one embodiment, the charger tester circuit 200 may include an AC power inlet 202, a circuit breaker 204, a power indicator 206, a power supply 208, a control relay 212, an AC power outlet 214, a voltmeter 216, an ammeter 218, a load port 220, an adapter port 222, and a DC jack 224.

The charger tester circuit 200 may utilize any number of configurations and is one implementation of a portion of the components of the charger tester 100 of FIG. 1. For example, the charger tester circuit 200 may include any number of amplifiers, filters, transformers, ports, adapters, boards, memories, processors, chips, programmable logic, and other similar components that, although not explicitly shown, may further enable the processes and functionality of the charger tester circuit 200 as herein described.

The AC power inlet 202 is an interface for receiving alternating current. The AC power inlet 202 may interface with a power cord, transformer, power interface, or plug for powering the charger tester circuit 200. The power supply 208 converts the alternating current into a voltage usable by the charger tester circuit 200 to power the internal components and power a charger during testing. As previously disclosed, the power supply 208 may include an interface for regulating the voltage standard applied to the charger.

The circuit breaker 204 is an automatically-operated electrical switch designed to protect the charger tester circuit 200 from damage caused by overload, short circuit, or overheating. For example, in response to a short in a charger, adapter module, or load module that begins to overload the charger tester circuit 200, the circuit breaker 204 may disable power to the charger through the AC power outlet 214 by disconnecting power through all or a portion of the charger tester circuit 200.

In one embodiment, the AC power outlet 214 may be a standard 120 V outlet. Alternatively, the AC power outlet 214 may include power outlets or interfaces for other world standards, vehicle chargers, USB chargers, and the power end of alternative types of chargers.

The control relay 212 is also an electrically operated switch that acts as a safety device. In one embodiment, the control relay 212 may activate power between the AC power outlet 214 and the DC jack 224 in response to the adapter module being inserted in the DC jack 224. As a result, the charger tester circuit 200 is self-energized based on insertion of the adapter module in the DC jack 224 and similarly powered down in response to removal of the adapter module.

The power indicator 206 may indicate that power is being supplied to the charger tester circuit 200 or to the AC power outlet 214. For instance, the power indicator 206 may light up when alternating current is received through the AC power inlet 202. The power indicator 206 may also light up when the AC power outlet 214 is actively supplying a voltage to a charger under test.

The load port 220 provides an interface for receiving the selected load module. The load port 220 may also provide a safety feature by acting as an AC power relay control in conjunction with the adapter port 222. For example, the load port 220 may include ports configured to receive banana plugs. Alternative types of connectors, terminals, and plugs may also be utilized for both the load port 220 and the load module. The load port 220 provides an interface for applying the resistive load across the charger tester circuit 200 in order to measure voltage, amps, and other performance characteristics of the charger. As previously described, the volt meter 216 and the ammeter 218 may measure voltage and current, respectively. In another embodiment, the load port 316 and load module 322 may be replaced by an internal programmable load. The load may be set utilizing a dial, touch screen, keypad, or external interface. For example, the charger tester 300 may include a communications interface, such as a USB port or Ethernet connection for updating a test application or logic of the charger tester.

The adapter port 222 provides one example of pins and wiring utilized to test the charger. In one embodiment, the adapter port 222 is configured to interact with the DC jack 224, such as an RJ-45 jack. The DC jack 224 may utilize spring loaded electrical connections to interface with the adapter module, such as an RJ-45 head.

In other embodiments, the charger tester circuit 200 may have more complex configurations for receiving user input through a user interface, such as a touch screen, voice commands, or other elements to dynamically configure the charger tester for testing a specified charger type. For instance, based on information from a user, the charger tester circuit 200 may locally retrieve or look up charger information through a network connection or database stored in memory to select the appropriate configuration and applicable load utilized to test the charger.

Figure 3A:
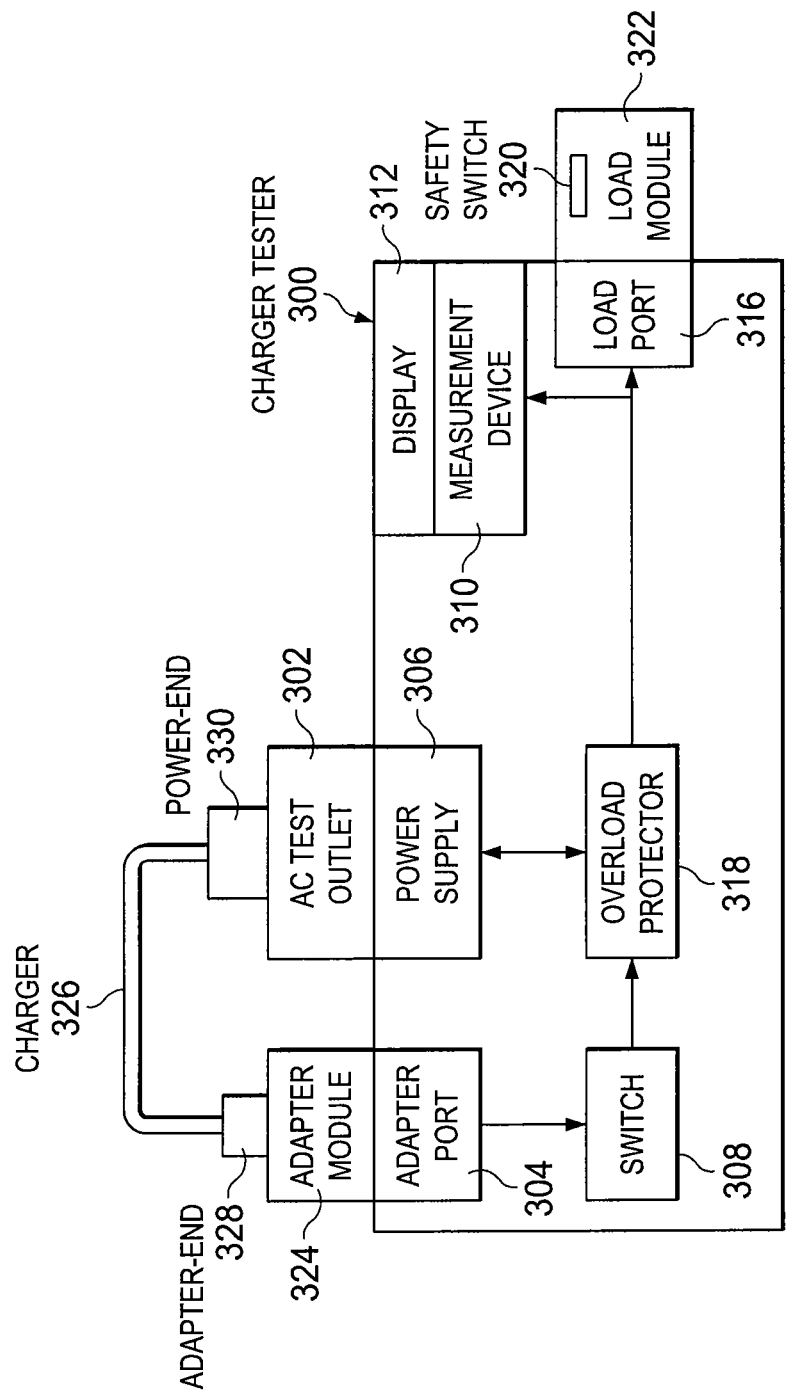
FIG. 3A is a pictorial representation of a power supply tester in accordance with an illustrative embodiment.
Figure 3B:
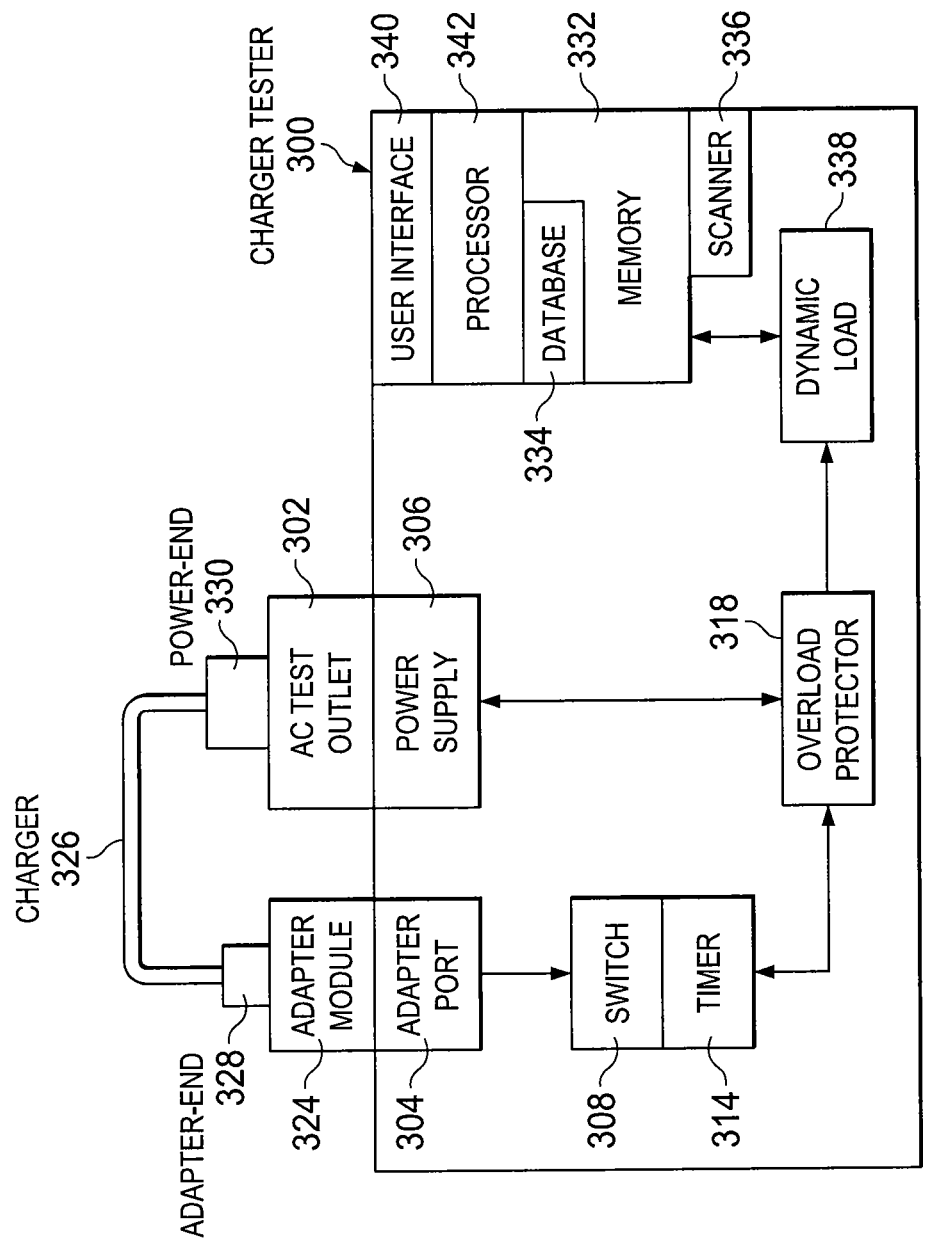
FIG. 3B is a pictorial representation of an alternative power supply tester in accordance with an illustrative embodiment.

Referring now to FIGS. 3A-B that provides alternative embodiments of a charger tester 300. The charger tester 300 of FIG. 3A may include an AC test outlet 302, an adapter port 304, a power supply 306, a switch 308, a measurement device 310, a display 312, a load port 316, an overload protector 318, a safety switch 320, a load module 322 and an adapter module 324. As previously described, the load module 322 and the adapter module 324 may be modularly connected or configured to test a charger 326 with an adapter-end 328 and a power-end 330. The configuration of the charger tester 300 in FIG. 3A generally corresponds to the embodiments of FIG. 1A, FIG. 1B and FIG. 2. All or portions of the charger tester circuit 200 of FIG. 2 may be implemented in the charger tester 300 of FIGS. 3A and 3B.

The modular design for the load module 322 and adapter module 324 allows loads and adapters for chargers to be easily replaced in the event of failure and changed out for testing different chargers without having charger specific testers.

As previously disclosed, the measurement device 310 may include the volt meter and ammeter that indicate the voltage and amperage drawn by the charger 326 during testing. The measurement device 310 may alternatively include other measurement circuits or modular testing elements configured for testing the charger 326, such as an ohm meter, tone sensor, fault detector, and other elements.

In another embodiment, the measurement device 310 may include indicators, such as light emitting diodes (LED)s, LED screen(s), or a textual display that indicates whether the charger 326 has passed the test executed by the charger tester 300. In some embodiments, LEDs indicating a test pass, test fail, or testing error may include for each charger being tested. The measurement device 310 may function in conjunction with the display 312 to audibly, visually, or otherwise indicate information and data to a user utilizing the charger tester 300. The measurement device 310 may include digital or analog thresholds or criteria indicating whether the charger 326 has passed a test. The measurement device 310 may utilize logic to indicate compliance or non-compliance of the charger 326 with the criteria.

The load module 322 may also include a safety switch 320. The safety switch 320 is a switch that prevents the resistive elements of the load module 322 from overheating or otherwise being damaged during the testing process. For example, the charger tester 300 may be utilized to perform numerous tests of chargers over an extended amount of time. During that time period, the load module 322 may heat substantially. As a result, the safety switch 320 provides an additional protection for the load module 322 that similarly protects the charger tester 300 beyond the protections provided by the switch 308 and the overload protector 318 as previously described. In one embodiment, the overload protector 318 includes a heat sink and fan or blower for dissipating the heat of the charger tester 300. As a result, the heat generated from testing one or multiple chargers simultaneously is dissipated. For example, the charger tester 300 may be configured to supply up to 3 A through each charger simultaneously requiring that significant heat from the power supply 306 be expelled to keep the charger tester operational. Dissipating heat may be particularly important for tests that require 1-10 minutes a piece. The charger tester 300 is configured to dissipate heat indefinitely during utilization with the heat sink and a blower cooling the components of the charger tester 300.

Turning now to FIG. 3B, the various embodiments of the charger tester 300 as herein disclosed may include components, elements and other configurations that may be combined selectively to provide specified features and technical configurations for testing purposes. In addition to those elements previously described, the charger tester 300 of FIG. 3B may further include a user interface 340, a processor 342, a memory 332, a database 334, a scanner 336, a timer 314 and a dynamic load 338.

The timer 314 may be utilized to ensure that the charger 326 is only tested or energized under test for a specified amount of time. In one embodiment, the timer 314 is a bi-metallic switch that is configured to test the charger tester 300 for approximately two to five seconds before disengaging the circuit powering the charger 326. The bi-metallic switch may prevent the charger tester 300 from overheating. The bi-metallic switch may be disengaged based on the time or current that it takes for a bi-metallic strip within the switch to be mechanically displaced thereby tripping the bi-metallic switch and severing the testing circuit. For example, the bi-metallic switch may disconnect the testing circuit after a current and/or time has heated the components of the bi-metallic switch to one or more threshold levels. In one embodiment, the bi-metallic switch may be integrated with the load module or dynamic load 338. The bi-metallic switch may disconnect the DC side of the charger for disconnecting the output of the charger as well as the power pins of the adapter module 324, such as pins 3 and 6 of an RJ45 jack.

In another embodiment, the timer 314 may be a digital or analog timer that performs the test for a specified amount of time once the adapter module 324 is inserted into the adapter port 304. For example, the timer 314 may be configured by a user to engage the circuit between the AC test outlet 302 and the adapter module 324 for three seconds to implement the test. However, the test may run for seconds or minutes based on the applicable testing requirements required by the charger type, service provider, OEM, or testing party. After three seconds, the timer 314 disconnects the circuit or voltage applied through the AC test outlet 302 to the power-end 330 of the charger 326 until the adapter module 324 is removed and then reinserted with the same charger 326 or another charger being tested. Alternatively, the charger tester 300 may incorporate any number of other timing elements that may ensure that the testing of the charger does not exceed a specified time period or to distinctly set a time period for testing the charger 326.

In one embodiment, the charger tester 300 is an interactive device capable of interacting with the user and similarly retrieving internally or externally stored information. For example, the charger tester 300 may include a wireless transceiver, network adapter, or other similar cards, ports, interfaces, boards, or components for communicating with one or more devices or wired or wireless networks for sending and receiving data required by the charger tester 300 or information received from a user. For example, as a number of tests are performed for specific chargers, an identifier, such as a part number or other label, may be associated with each charger and the results of the test for the charger may be stored in an externally located database that may be updated based on tests performed utilizing the charger tester 300. As a result, test results may be automatically or selectively communicated to one or more external devices, memories, or databases for access or storage. In another embodiment, the timer 314 may utilize a significantly increased amount of time. For example, the timer 314 may power the charger 326 for long enough to thoroughly test the charger 326 once heated by resistance. In addition, the charger tester 100 may run multiple tests on the charger 326 including varying the applied voltages, currents, and load.

In one embodiment, the user interface 340 may include one or more interfacing elements for receiving user input and information. The user interface 340 may include a touch screen, keypad, keyboard, scroll wheel, buttons, switches, mouse, or other internally or externally integrated peripherals. The user interface 340 may be utilized to receive information regarding the charger 326 or the associated electronic device. For example, the user may access the user interface 340 to specify a brand of cell phone or electronic device that is charged or powered by the charger 326. Based on the user providing this information through the user interface 340, the charger tester 300 may utilize the memory 332, database 334, or other configurable logic in the charger tester 300, to configure the dynamic load 338. For example, based on a selection of a Motorola phone associated with the charger 326, the dynamic load 338 may be configured to specific load values to best simulate actual operation of the charger 326 in a real world environment. The database 334 may be updated automatically or manually. For example, OEM or service provider servers or database may be accessed to determine the testing parameters, acceptable threshold and tolerance levels, and testing scripts or procedures that may be required for testing associated chargers. The database 334 may be updated automatically or in response to the user uploading updates or prompting the charger tester 300 to find updates.

The processor 342 is circuitry or logic enabled to control execution of a set of instructions. The processor 342 may be microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks. The processor 342 may be a single chip or integrated with other computing or communications elements.

The memory 332 is a hardware element, device, or recording media configured to store data for subsequent retrieval or access at a later time. The memory 332 may be static or dynamic memory. The memory 332 may include a hard disk, random access memory, cache, removable media drive, mass storage, or configuration suitable as storage for data, instructions, and information. In one embodiment, the memory 332 and processor 342 may be integrated. The memory may use any type of volatile or non-volatile storage techniques and mediums.

The memory 332 and/or database 334 may store data, information, specifications, or configurations for a number of chargers and associated electronic devices. For example, the database 334 may store configurations of the dynamic load 338 for a number of different phone models, device types, adapters, versions, and so forth. As a result, the user interface 340 may more accurately indicate to the user whether the charger 326 has passed one or more tests based on criteria, parameters, thresholds, percentages and requirements for the charger as stored in the database 334. The memory 332 and database 334 may be updated through a network connection as previously described. Additionally, the user interface 340 may include other interfaces, such as a USB port for updating the database 334 through a thumb drive or other externally connected device or storage element. The memory 332 may store testing scripts that run one or more tests on the charger 326 simultaneously or in series. The testing scripts may be executed by the processor 342 to test the functionality and performance characteristics of the charger 326.

In one embodiment, the memory 332 may store load values associated with each adapter module 324, such that when the adapter module 324 is connected to the charger tester 300 the load values are automatically applied by the charger tester.

In one embodiment, the memory 332 or database 334 may store a table. The table may be utilized to look up data or information for configuring the dynamic load. For example, based on user input received through the user interface 340 or information automatically determined by the charger tester 300, the table may configure the dynamic load 338. The table may also be utilized to determine functionality or non-functionality of the charger 326 based on the performance characteristics measured during testing of the charger 326. For example, based on threshold values for voltage, current, and resistance, the table may display a pass or fail indicator through the user interface 340. The table may store a number of threshold values for passing, failing, or generating a diagnostic for each charger.

In one embodiment, different OEMs or service providers may have specific test configurations, scripts, specifications, tolerances, or parameters that are required for chargers utilized or associated with their company, products, or network. In another embodiment, the charger tester 300 may include the scanner 336. The scanner 336 may automatically determine the charge testing parameters and information associated with the charger 326.

In one embodiment the scanner 336 is a barcode scanner that scans a barcode, numbers, engravings, or other markings engraved on or attached to the charger 326 by a sticker, label, or other indicator. The scanner 336 may communicate with the processor 342 and memory 332 to retrieve the relevant charge testing information, image, or data for identification. As a result, based on one or more scans, any number of devices may be tested utilizing a single parameter or test script. Similarly, the scanner 336 may note specific information for each charger 326, such as an item identification number to store the results of the test to further distribute, recycle, scrap, or otherwise process one or more chargers based on the results of successful or unsuccessful tests. Most chargers include an attached or engraved label, identification, or bar code. In one embodiment, the scanner 336 is an optical imager that utilizes optical character recognition to determine the applicable voltage, amperage, manufacturer, and applicable load. The scanner 336 may utilize a light, flash, or different imaging processes to distinguish the writing of the label especially where the background color and the writing are the same color (e.g. black background of the charger has black writing or white writing on a white background).

In another embodiment, the scanner 336 may be a radio frequency identification (RFID) tag reader. The RFID tag reader may identify or retrieve information from an RFID tag integrated with the charger 326 or associated with the corresponding mobile device. The charger tester 300 may similarly configure the dynamic load 338 based on the RFID tag or the barcode to quickly and efficiently implement testing.

Loads may be applied by the dynamic load utilizing electronic switching having specific data read from the OEM stored file by scanning the charger or associated electronic device or determining the IMEI of the phone with which the charger is associated. The dynamic load 338 may represent a physical resistive array and may be configured based on the load requirements of the charger. For example, OEM Motorola requires 5 ohms at 10 watts; this configuration may be created by selecting the actual single resistor or a combination of resistors (in series or parallel) which equates to the needed load. Another charger tester 300 or method may utilize a similar resistive array that is manually selected by a user though a series of switches for the specific charger under test.

In yet another embodiment, the charger tester 300 may be utilized to interface with batteries or other energy storage devices. The condition and status of the battery may be tested utilizing the charger tester 300 and one or more interfaces adapted to connect the battery to the charger tester 300. The charger tester 300 may include sense lines for feedback and thermal sensing. The charger tester 300 may be utilized to test individual cells or arrays of cells within the battery to determine functionality and capabilities of the batteries under test. The battery testing function of the charger tester 300 may allow use of common circuitry and functions including AC and DC power elements. The charger tester 300 may also enable data transfer of battery status for record keeping and may include multiple interfaces allowing for simultaneous testing of different battery types. After charging is complete the variable load array may be selected to implement battery testing, allowing the charger tester 300 to select an electronically proper load. Test results may be saved, archived, or accessed as needed. The modular elements of the charger tester 300 provide an integrated approach that requires less redundant circuitry than a separate standalone unit for testing chargers or batteries. In the event of failure of one or more elements of the charger tester 300, replacing modular or otherwise fixing the charger tester 300 is quick and cost effective.

In one embodiment, the charger tester 300 may be configured to test multiple chargers sequentially or simultaneously. As a result, the charger tester may include multiple ports for receiving the relevant adapter modules and load modules. The other components of the charger tester 300 may be similarly configured.

In another embodiment, the processor 342 may execute a script to scan the charger 326. The scan may provide characteristics of the charger 326. The results of the scan may be compared to other scan results to determine the type and configuration of the charger 326 in order to configure the dynamic load 338 and the tests run by the charger tester 300.

Figure 4A:
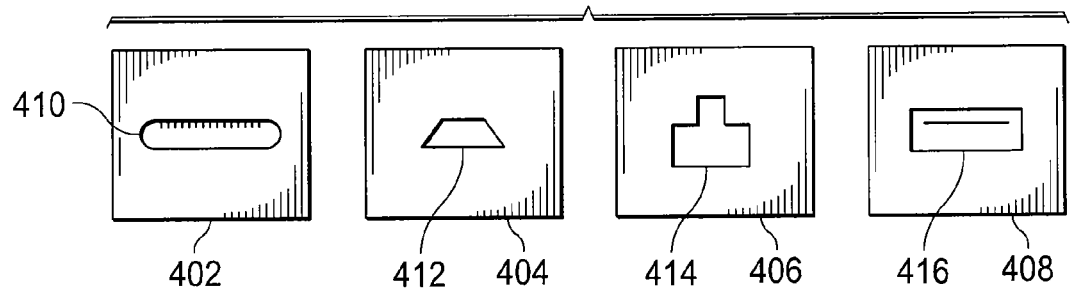
FIG. 4A-B is a pictorial representation of an adapter module in accordance with an illustrative embodiment.
Figure 4B:
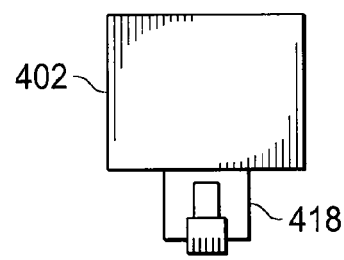

Referring now to FIGS. 4A-B, FIG. 4A illustrates a front-view of adapter modules 402, 404, 406, and 408. FIG. 4B illustrates a top-view of the adapter module 402 which is similarly representative of other adapter modules. The adapter modules 402, 404, 406, and 408 include ports 410, 412, 414, and 416, and connector 418.

The adapter modules 402, 404, 406, and 408 represent a few of many possible adapter modules that may be utilized with the charger tester to test or evaluate different types of chargers. As is well known, many of the chargers may utilize DC connectors or adapter-ends with specific voltages, polarity, current rating, power supply filtering and stability, and mechanical configurations that are incompatible with other chargers and mobile devices. The ports 410, 412, 414, and 416 are configured to receive specific types of adapter-ends of the chargers. For example, the ports 410, 412, 414, and 416 may be configured to receive mini or micro-USB connectors and numerous other types of adapter-ends of the chargers associated with handset manufacturers, services providers, and standards.

The pins, traces, or electrical connection elements of the ports 410, 412, 414, and 416 are connected to the connector 418. The connector 418 is a uniform adapter that allows the adapter modules 402, 404, 406, and 408 to be connected to the charger tester through a single port or jack, such as, for example, through the adapter port 222 of FIG. 2. The pins, leads, or connectors of the ports 410, 412, 414, and 416 and connector 418 allow the charger to be tested as if it were connected to an actual electronic device for charging or operation.

In one embodiment, the charger tester may supply power through the charger in response to a user inserting the connector 418 into a corresponding port of the charger tester. In one embodiment, the connector 418 represents an RJ45 head or connector. The connector 418 may be an RJ45 head based on know data regarding reliability and durability over time. RJ45 heads are also easily identifiable, oriented, and inserted or removed from the charger tester. In one embodiment, the connector 418 may not include a locking tab that locks once inserted in a corresponding jack or port. Alternatively, the connector 418 may be any number of other male-connector types including USB or other similar connector types.

Figure 5A:
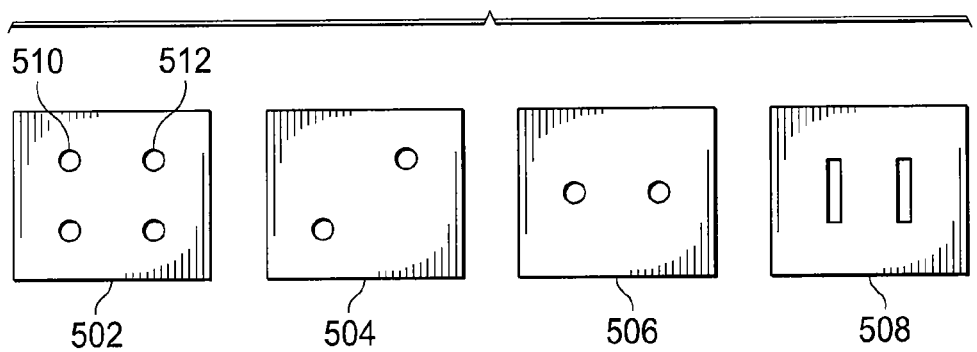
FIG. 5A-B is a pictorial representation of a load module in accordance with an illustrative embodiment.
Figure 5B:
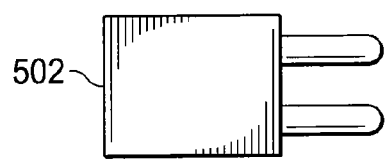

FIG. 5A illustrates a front-view of load modules 502, 504, 506, and 508. FIG. 5B illustrates a side view of the load module 502. With regard to FIGS. 5A-B, the load modules 502, 504, 506, and 508 are resistive loads that simulate the load placed on a charger during the charging process. The load modules 502, 504, 506, and 508 may include two or more connectors 510 and 512. The connectors 510 and 512 electrically connect the resistive load of the load modules 502 to the charger to complete the testing circuit. For example, the connectors 510 and 512 may be connected across the load port 220 of FIG. 2 to apply a load across the corresponding portions, pins, or conductors of the charger. The connectors 510 and 512 may be banana connectors or other similar connectors or terminals.

In one embodiment, the load modules 502, 504, 506, and 508 (and the adapter modules 402, 404, 406, and 408 of FIG. 4) may be labeled, engraved, or color coded to indicate a charger or mobile device type associated with the load module and the orientation of the load modules 502, 504, 506, and 508 for connection to the charger tester. This information may be automatically or manually scanned or read by the charger tester. In one embodiment, the charger tester includes a single load port configured to receive the two or more connectors of the load modules 502, 504, and 506. However, the charger tester may alternatively include additional ports or the ports may be configured to receive alternative types of connectors as shown by load module 508. In one embodiment, multiple load modules may be utilized to reach a specified resistive load.

The adapter modules 402, 404, 406, and 408 of FIG. 4 and the load modules 502, 504, 506, and 508 of FIG. 5 may be replaced or changed out in response to failure due to repeated use or other problems. As a result, the charger tester may be reconfigured and continue to remain operational despite failures of the modular components. The switches and ports, such as the adapter port and load port, of the charger tester may also be modularly integrated with the charger tester in order to replace or exchange portions of the charger tester as needed. In another embodiment, the adapter modules 402, 404, 406, and 408 of FIG. 4 and the load modules 502, 504, 506, and 508 of FIG. 5 may be integrated with the charger tester so that only the adapter-end or power-end of the charger is inserted into the charger tester.

Figure 6:
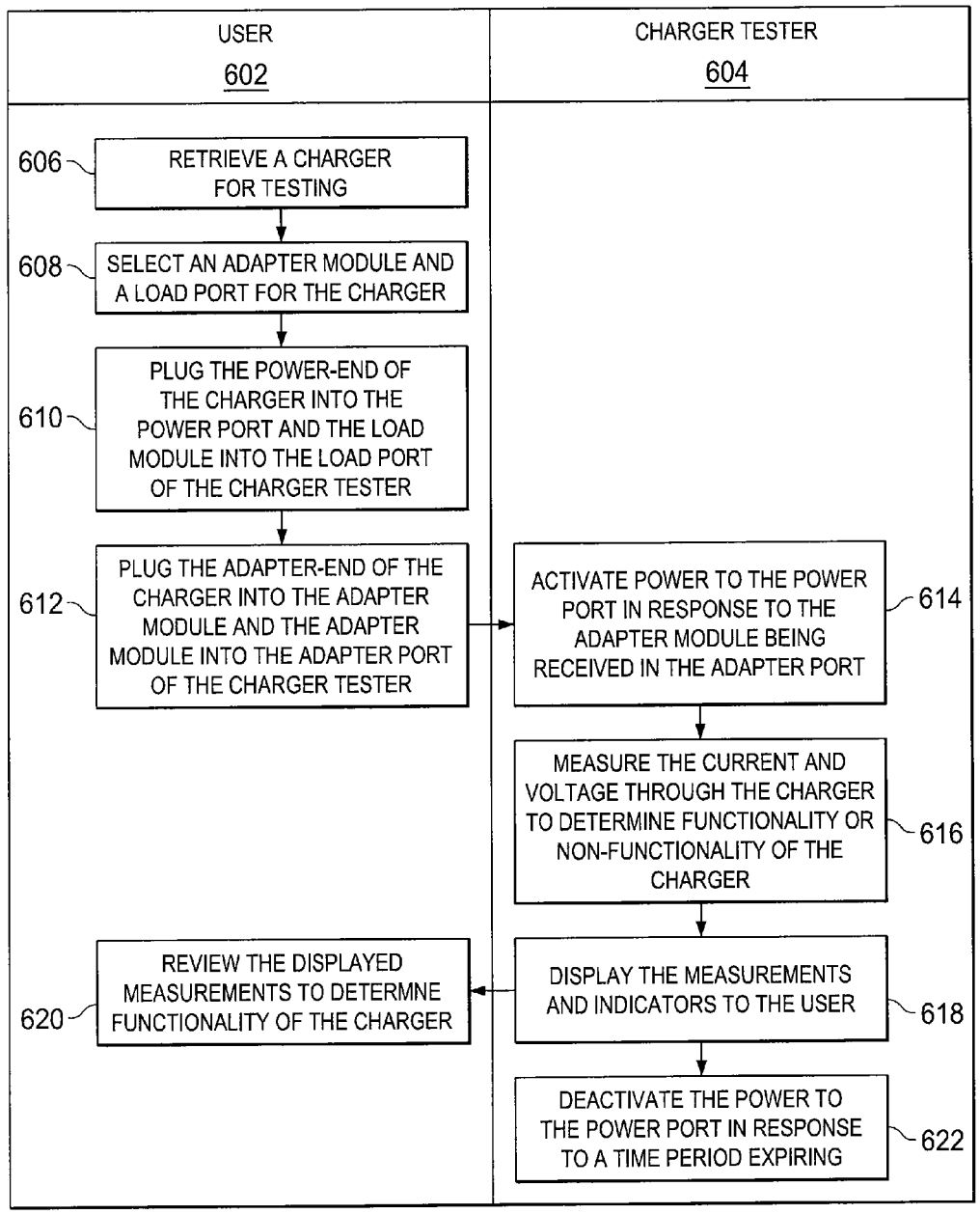
FIG. 6 is a flowchart of a process for testing a power supply in accordance with an illustrative embodiment.

FIG. 6 is a flowchart of a process for testing a charger in accordance with an illustrative embodiment. The process of FIG. 6 may be implemented by a user 602 and a charger tester 604 in accordance with one embodiment. The order of the steps in FIGS. 6 and 7 may be varied based on environment, conditions, and user preferences.

The process may begin with the user 602 retrieving a charger for testing (step 606). The charger may be tested as part of a manufacturing, returns, replacement, refurbishment, or repair process or other procedure that may require verification of the functionality of the charger.

Next, the user 602 selects an adapter module and a load module for the charger (step 608). The adapter module and the load module represent adapters or modules for testing the specific model or type of charger. The adapter module and the load module may include labels, markings or other indicators associating each with one or more makes, models, or types of mobile devices for identification by a user or automated element, such as a scanner.

Next, the user 602 plugs the power-end of the charger into the power port and the load module into the load port of the charger tester (step 610). In other embodiments, the charger tester may be utilized to test chargers for vehicles, battery packs, or other similar electronic elements.

Next, the user 602 plugs the adapter-end of the charger into the adapter module and the adapter module into the adapter port of the charger tester (step 612).

Next, the charger tester 604 automatically activates power to the power port in response to the adapter module being received in the adapter port (step 614). As previously described, both the load module and the adapter module must be electrically connected to the charger tester in order for the charger to be energized.

Next, the charger tester 604 measures the current and voltage through the charger to determine functionality or non-functionality of the charger (step 616).

Next, the charger tester 604 displays the measurements and indicators to the user (step 618). The measurements and indicators may be displayed in alphanumeric format or utilizing visual indicators, such as a screen, green or red LEDs, or other displays to indicate that the charger has passed or failed according to specified parameters stored by the charger or utilized by the user 602.

Simultaneously, the user 602 reviews the displayed measurements to determine functionality of the charger (step 620). The display may also flash red or green or words, such as "Pass" or "Fail." Where multiple chargers are being tested simultaneously, the charger tester 604 may include pass or fail LEDs for each charger. The LEDs may stay lit with the results (i.e. pass or fail) until the testing is completed or otherwise deactivated by the user.

The charger tester 604 may also deactivate the power to the power port in response to a time period expiring (step 622). The power may be deactivated utilizing a timer, a bi-metallic switch, or other timing element.

Figure 7:
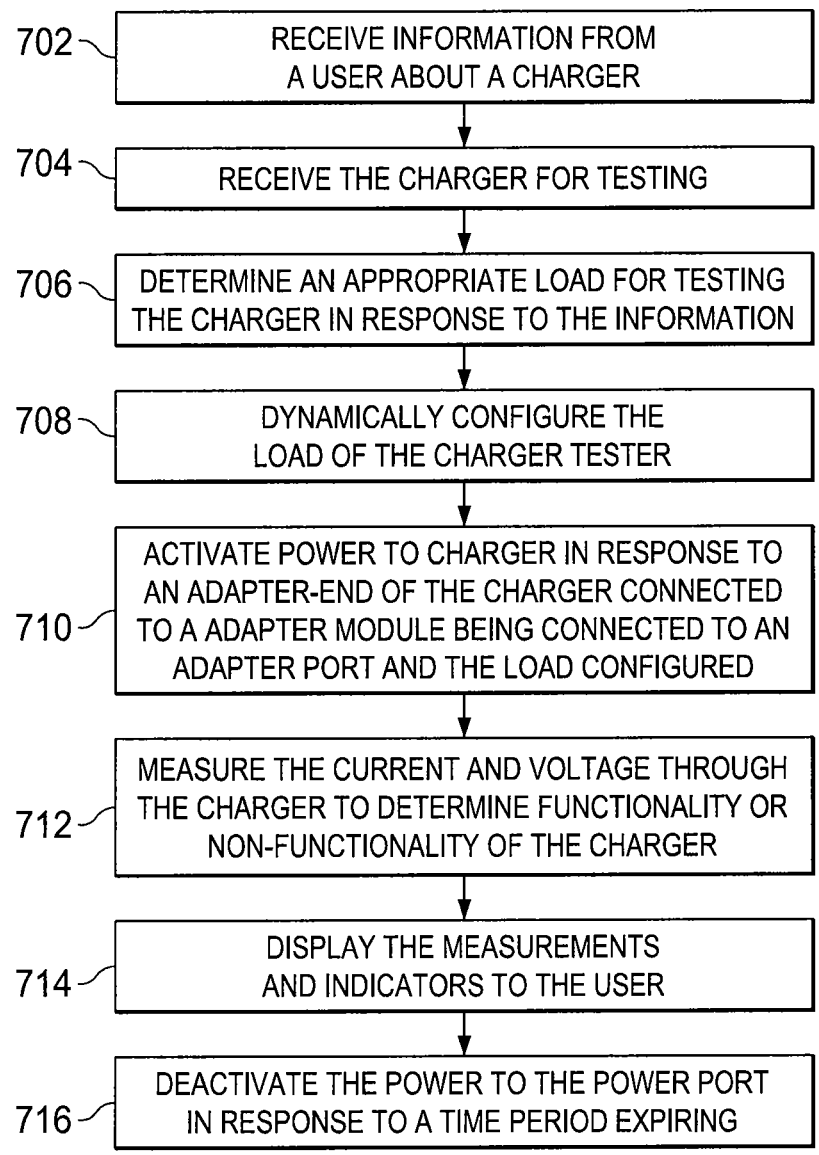
FIG. 7 is a flowchart of another process for testing a power supply in accordance with an illustrative embodiment.

FIG. 7 is a flowchart of another process for testing a charger in accordance with an illustrative embodiment. The process of FIG. 7 may be implemented by a charger tester based on interaction with a user to test a charger. The process may begin by receiving information from a user about a charger (step 702). The information may include functional parameters for the charger and the associated device. For example, the information may specify a make, model, operating system version, or other information associated with the charger. In one embodiment, the charger tester may include a scanner, such as a barcode scanner that scans a barcode or other identification information on the charger.

Next, the charger tester receives the charger for testing (step 704). For example, the power-end of the charger may be connected to the charger.

Next, the charger tester determines an appropriate load for testing the charger in response to the information (step 706). For example, particular brands of charger testers may require a specified resistive load to simulate the load required to charge the mobile device. The load may also be varied during testing to ensure functionality at minimum to maximum load parameters.

Next, the charger tester dynamically configures the load of the charger tester (step 708). The charger tester may also set fixed or variable testing parameters and how the test results are recorded.

Next, the charger tester activates power to the charger in response to an adapter-end of the charger connected to an adapter module being connected to an adapter port and a load configured (step 710). The charger tester may power the charger in response to determining or sensing that the adapter module has been inserted in the test port. In another embodiment, insertion of the adapter module automatically completes the testing circuit to initiate testing.

The charger tester measures the current and voltage through the charger to determine functionality or non-functionality of the charger (step 712). The determination may be made based on testing or measurements scripts or programs executed by the charger tester.

Next, the charger tester displays the measurements and indicators to the user (step 714). The measurements and indicators may also be stored and/or communicated to an external device.

The charger tester deactivates the power to the power port in response to a time period expiring (step 716). The time period may be determined electronically or mechanically. For example, a digital or analog timer or bi-metallic switch may be utilized. The timer may disconnect power to the charger after a period of two to five seconds as set by testing parameters or a user. The bi-metallic switch may disconnect power to the charger in response to a temperature of the bi-metallic switch reaching a certain point or overheating due to current passing through the bi-metallic switch. The process of FIG. 7 may be similar to the process of FIG. 6.

Another illustrative embodiment provides a test station or testing system for testing numerous power supplies at one time. The test station may be configured to test numerous power supplies simultaneously while allowing even more power supplies to be connected or disconnected from the test station at the same time. In one embodiment, the test station may be configured to support batched testing of power supplies. As a result, the test station and the corresponding resources may be utilized more efficiently. For example, the test station may run a first battery of tests on one batch of power supplies while a second batch of power supplies are being connected to the test station for testing once the first batch is completed. The test station provides the benefit of testing a large number of power supplies at one time while most efficiently utilizing the resources that make up the test station. As a result, materials, time, and expenses are saved benefiting individuals, companies, organizations, and the environment.

Figure 8:
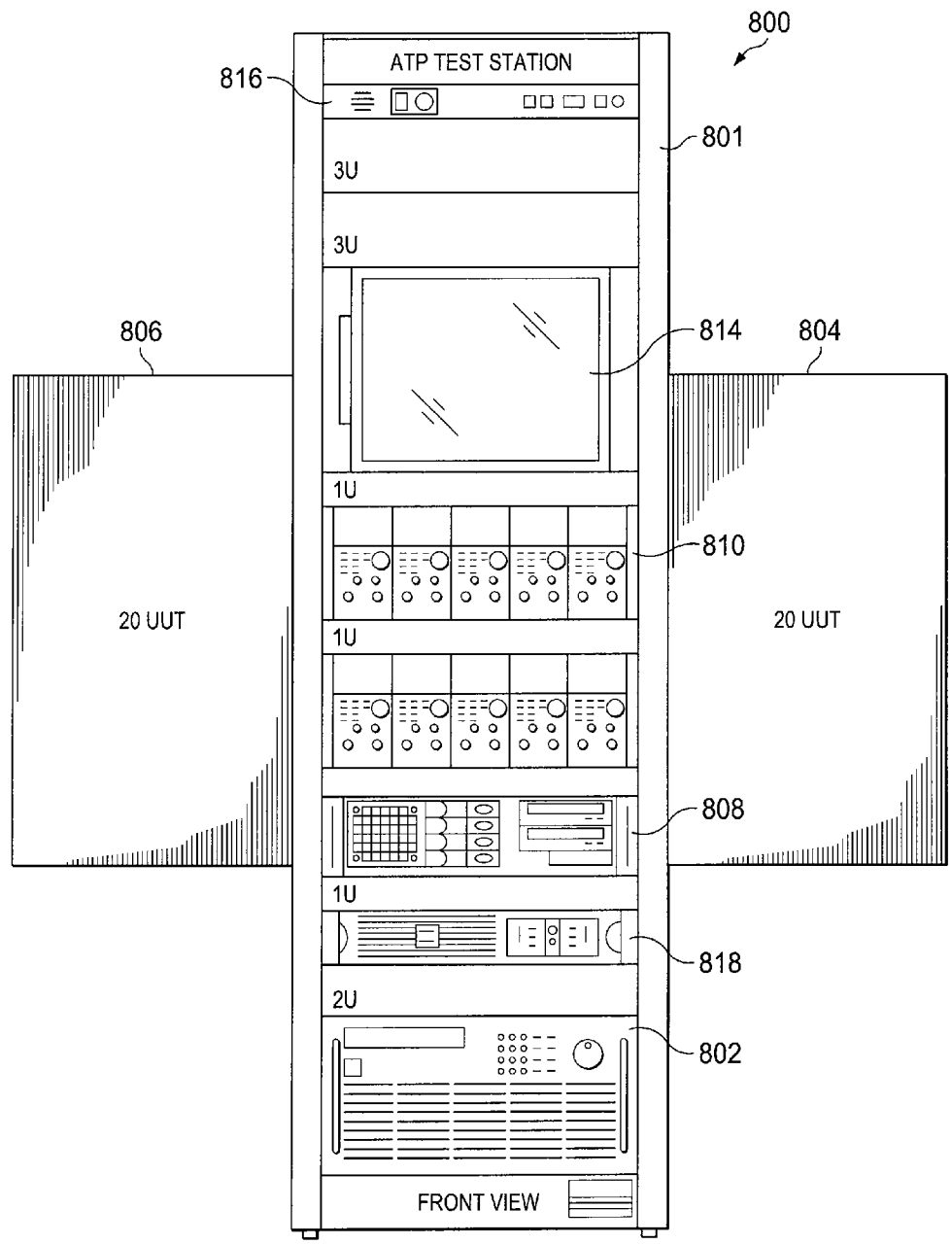
FIG. 8 is a pictorial representation of a test station in accordance with an illustrative embodiment.

FIG. 8 is a pictorial representation of a test station 800 in accordance with an illustrative embodiment. The test station 800 may include any number of components. In one embodiment, the test station 800 includes a test frame 801, a power source 802, test panels 804 and 806, a system controller 808, a variable load 810, relays 812, a display 814, an emergency stop 816, and a universal power supply 818. Power supplies are referred to generically as one of the many devices, accessories, or units under test that may be evaluated and tested by the test station 800.

The test frame 801 is the framework that supports the components of the test station 800. In one embodiment, the test frame 801 is a metal frame and cabinet that includes a number of shelves, racks, drawers, channels, ports, or other components for receiving each portion of the testing station 800. For example, the test frame 801 may be a rack cabinet that includes wheels or casters for moving the test fixture 800 from one location to another, side panels, back access the doors, pre-wired fan tops, and electronic stop device to remove power from the power supplies in case of emergency, a keyboard drawer (including a keyboard and mouse), and a panel to protect the instruments for manual operation.

The test frame 801 may include one or more transparent screens or kick plates that cover the front of the test frame 801 to protect the test instruments from any accidental interaction between the user, or facility environment and the components of the test station 800. In one embodiment, the test frame 801 may be powder coated and may include rounded corners and edges to prevent damage to the power supplies as well as injury to the user. Similarly, the back of the test frame 801 may include removable panels that prevent inadvertent contact with the components of the testing system 800.

The test frame 801 may include a fixture assembly which provides a mechanical and electrical interface to each of the power supplies tested. For example, the test frame 801 may include a number of communications and power channels, wires, buses, cables, or other signaling mediums for each of the components of the test station 800. For example, the test station 800 may include a number of digital input and digital output cards for receiving signals, sensor readings, and other inputs or outputs. The AC connections between the test frame 801 and the test panels 804 and 806 may also be double insulated for safety purposes and to prevent crosstalk. The signal lines or cables to each of the test panels 804 and 806 may be combined into a wiring harness.

The test station 800 may be configured to test various types of power supplies with minimal user input. The test station 800 may also require specific configuration of adapters loads and software for testing specific types of power supplies. In one embodiment, in response to a user selecting a type of power supply to be tested, the test station 800 configures or reconfigures itself for the specified type, make, or model of power supply. In one embodiment, the test station 800 may perform tests, such as a power test, an open load test, a load test, and a short recovery test. During the tests, the test station 800 may executing a program to ensure that the necessary information has been received from the user, the correct communications paths/channels are being utilized through the relays, the power source 802 is properly configured (e.g. voltage, amperage, rise, time, etc.), the variable load 810 is properly configured, the test is performed for a specified time period, and the output is being measured. The variable load 810 may acts as electronic direct current loads for testing power supplies. The test station 800 may also associate and store testing information, such as test parameters input by the user, retrieved from a database, and received electronically, for repeatedly testing specific models or types of power supplies. As a result, the user may select a model type and the test station 800 may configure itself based on previously saved testing parameters.

Figure 9:
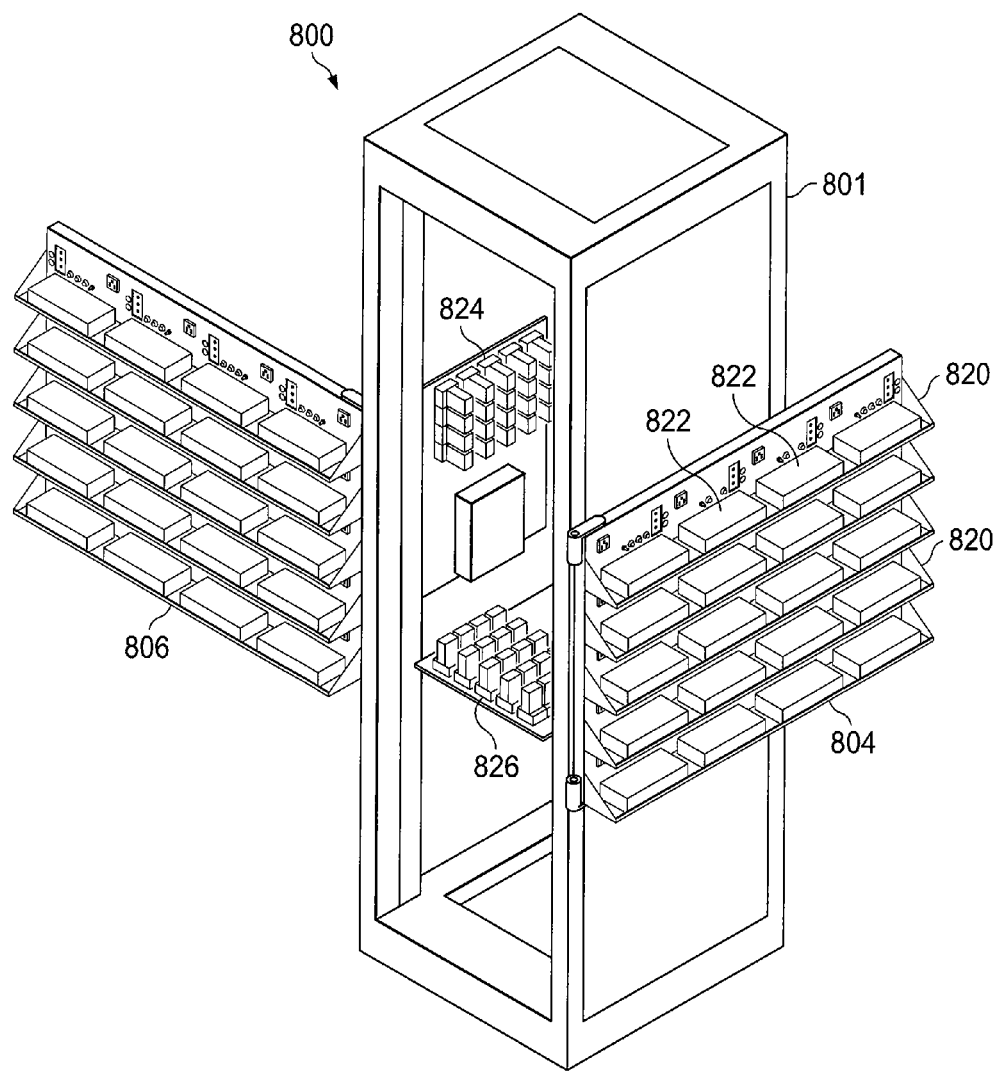
FIG. 9 is a pictorial representation of the test station in accordance with an illustrative embodiment.
Figure 10:
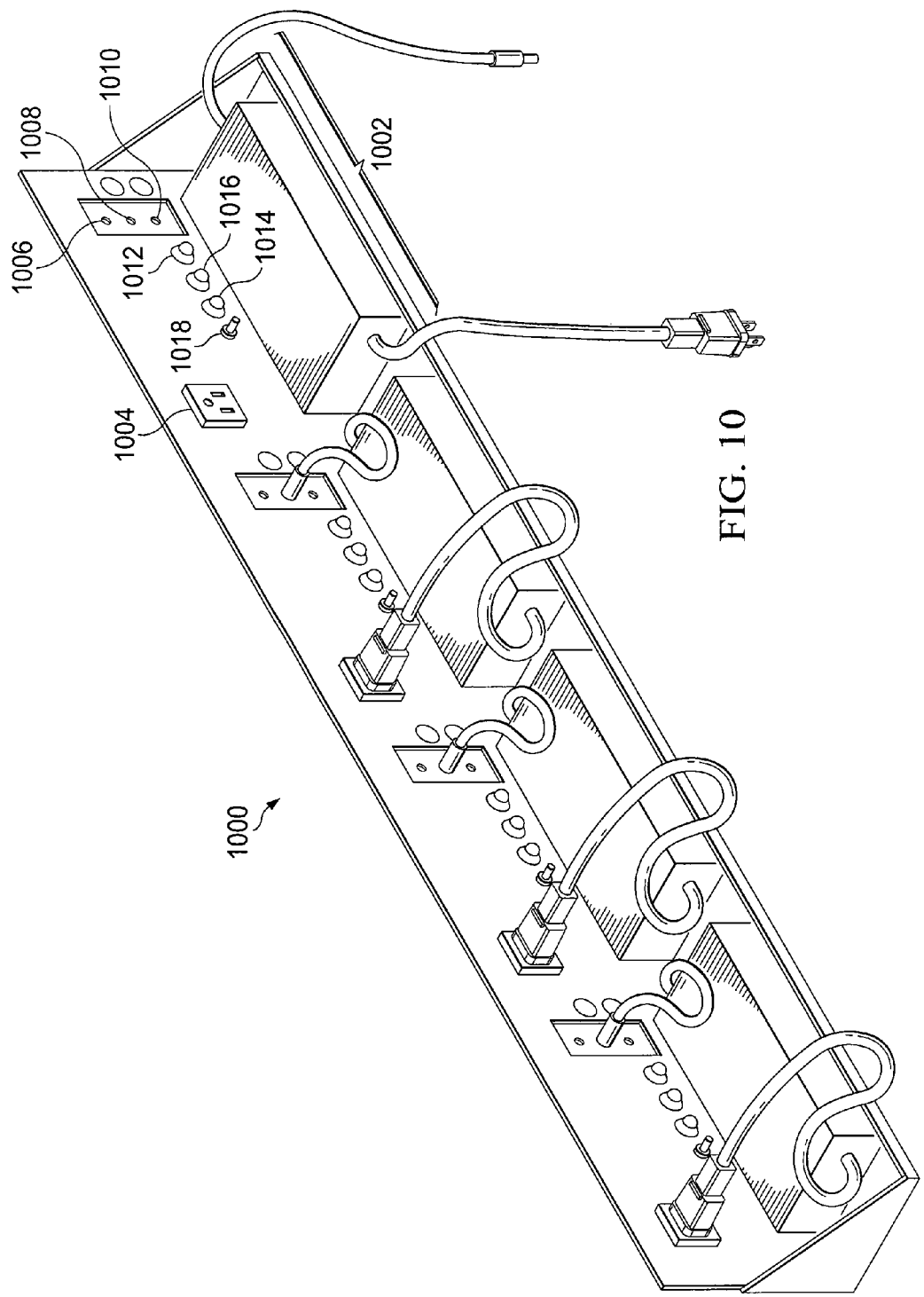
FIG. 10 is a pictorial representation of a tray of the test station in accordance with an illustrative embodiment.

The test panels 804 and 806 are further illustrated in FIGS. 9-10. The test panels 804 and 806 may also be referred to as a left panel and a right panel. The test panels 804 and 806 may be loaded on a front side only, a rear side only, or both the front and rear sides. The test panels 804 and 806 are configured to connect to each of the power supplies and control testing for each individual power supply. The test panels 804 and 806 are also configured to physically secure or hold the power supplies during testing. In one embodiment, the test panels 804 and 806 are handedly connected to the test frame 801 for optimizing the positioning of the test station 800 for one or more users. The test panels 804 and 806 may also be locked into place. For examples, a hinged rod with a locking pin may be utilized to lock the test panels 804 and 806 to the test frame 801.

The system controller 808 controls the testing, performed by the test station 800. In one embodiment, the system controller 808 is an industrial or personal computer (e.g. double core processor, 4 GB RAM, 1 TB hard drive, Windows based). The system controller 808 may include any number of processors or processing units, as well as memories for executing instructions to control and manage the testing of the power supplies. In addition, the system controller 808 may include any number of adapters or adapter cards for communicating with other instruments, sensors, relays, and indicators (not shown). For example, the adapters which include hardware and software tools, instruments, and busses may be configured for GPIB, USB, Ethernet, MXI, LAN, for communication with the software tools and instrument drivers of the test fixture 800.

In one embodiment, the display 814 is a high resolution television or computer monitor. For example, the display 814 may be an LED, OLED, or plasma display. The display 814 may also be a touch screen or may communicate with a touch screen device, such as a tablet computer, wireless device, or remote control. Although not shown, the test fixture 800 may include a keyboard and pointing device, such as a mouse or trackball, for receiving user information, data, or input.

The emergency stop 816 may be utilized to power down the test fixture 800. The emergency stop 816 may cut power to all or portions of the test fixture 800 in the event of shorts, fires, or malfunctions in the test fixture 800 or the units under test. In one embodiment, the emergency stop may also include a PDU controller as is herein described.

The test fixture 800 may also include the un-interruptible power supply 808 to protect the system controller 808 and the other components of the test fixture 800 in case of a power failure, power surges, and other electrical anomalies. The test fixture 800 may also include a barcode scanner, RFID reader, optical recognition device, or other information, retrieving component for determining information associated with a power supply, user, or other relevant information. For example, the test fixture 800 may utilize optical character recognition to determine model or type information associated with the power supply. The system controller 808, display 814, or other component may include speakers for giving an audio indication to the user indicating whether each power supply passed or failed the testing. For example, audio indications may include a beeping alarm, voice indicating "fail", or other sound that is played at the time failure is detected, at the end of the process, or based on a user request for an indication.

In one embodiment, a test procedure performed by the test station 800 may encompass setup, testing, and cleanup. In one embodiment, setup for the test station 800 may include the power source 802 configuring a current limit, disabling the output of the power source 802 and opening all AC relays. During testing, the test station 800 may perform the following for each of the units under test: enable an AC relay, enable the power source 802 output, validate current protection, measure output voltages, disable the AC relay, and perform a short circuit test. During cleanup, the test station 800 may disable the power source 802 output, close the AC relays for the power supplies that pass, and open the AC relays for power supplies that failed.

FIG. 9 is a pictorial representation of the test station 800 in accordance with an illustrative embodiment. Various components of the test station 800 are not shown in FIG. 9 to further illustrate the test frame 801. Test station 800 further illustrates the test panels 804 and 806. In one embodiment, each of the test panels 804 and 806 may include a number of trays 820 that support power supplies 822 during testing. One or both sides of the test panels 804 and 806 may include the components shown in FIGS. 9 and 10. In one embodiment, the test panels 804 and 806 are hinged to more easily position the test station 800 for the user.

An example of the trays 820 is further illustrated in FIG. 10. In one embodiment, the power supplies may be tested in batches corresponding to the test panels 804 and 806. For example, each of the test panels 804 and 806 may include five trays 820, each of which supports four power supplies for a total of twenty power supplies per test panel 804 and 806. However, the number of trays 820 and power supplies 822 that may be supported may be increased or decreased based on the application and testing organization. For example, ten or more power supplies may be tested at once. In another embodiment, the test panels 804 and 806 may include trays 820 and the corresponding circuitry on both sides.

The test station 800 also illustrates AC relays 824 and DC relays 826 that may be mounted to the test frame 801 and which are subsequently described. The relays 824 and 826 may be utilized to power the power supplies in designated order, switch testing instrumentation, and apply electronic loads to the power supplies.

FIG. 10 is a pictorial representation of a tray 1000 of the test station in accordance with an illustrative embodiment. The tray 1000 may include multiple fixture nests, such as fixture nest 1002. The tray 1000 includes a substantially vertical portion for supporting or integrating the fixture nests. The trade 1000 may also include a substantially horizontal portion for holding a body or wire of the power supply. In one embodiment, the horizontal port action may include a lip for further securing the power supplies during testing.

In one example, the tray 1000 includes four fixture nests. The fixture nests may be spaced and configured such that the body of the unit under test as well as the corresponding wires or cables may be supported by the tray 1000. In addition, the components of the fixture nest 1002 are positioned such that they are visible even when the corresponding power supply is positioned within the tray. Each fixture nest 1002 may include an AC outlet 1004, DC plugs 1006, 1008, and 1010, a test pass LED 1012, a test fail LED 1014, and a test in progress LED 1016, and a resettable circuit breaker 1018. The AC outlet 1004 simulates a typical AC outlet in a home or business. The DC plugs 1006, 1008, and 1010 may be color-coded and correspond to DC jacks utilize for most power supplies (e.g. 5.5 mm/2.1 mm, 5.5 mm/1.65, 6.5 mm/3.0 mm). For example, the following jacks may be provided as the power plugs 1006, 1008, and 1010 a PJ-102AH 2.1 mm×5.1 mm power jack, a PJ-048H 3.0 mm×7.3 mm power jack, and a DS-210B 1.7 mm (G) power jack.

In one embodiment, the DC plugs 1006, 1008, and 1010 may be integrated with one or more interchangeable interfaces. As a result, the appropriate interchangeable interface and DC plug may be interconnected with the fixture nests 1002 to perform testing. The DC plugs 1006, 1008, and 1010 may be changed out as a group or individually. In addition, the DC plugs 1006, 1008, and 1010 may be more easily replaced once they have worn out or failed. In one embodiment, the entire fixture nest 1002 may be replaced as a unit or the components may be replaced as individual modules. The test passed LED 1012 indicates when a corresponding power supply has passed the one or more tests. The test fail LED 1014 indicates when the corresponding power supply has failed the one or more tests for any number of reasons. The test in progress LED 1016 indicates when the corresponding power supply is being tested. The LEDs 1012, 1014, and 1016 are displayed to help the user manually process the power supplies according to the results and to prevent the power supplies from being removed prematurely during testing.

In one embodiment, the DC plugs 1006, 1008, and 1010 are configured to detect when a jack or plug is physically inserted. For example, the DC plugs 1006, 1008, and 1010 may include a terminal, switch, or circuit that is completed or activated when a jack is physically inserted into the DC plugs 1006, 1008, and 1010. As a result, the testing station 1000 may determine when each power supply is connected to the testing station, 1000. The test station may determine whether the AC and DC ends (where applicable) are connected to the testing station 1000.

In one embodiment, the fixture nest 1002 includes the resettable circuit breaker 1018 to protect the testing system from a situation where a defective power supply causes a short circuit through the AC outlet 1004. In one embodiment, the resettable circuit breaker 1018 includes a color-coded band that indicates when the resettable circuit breaker 1018 has been activated. In one embodiment, to reset the resettable circuit breaker 1018, the user pushes an associated button or flips and associated switch. For example, the resettable circuit breaker 1018 may be rated for 3 A.

Figure 11:
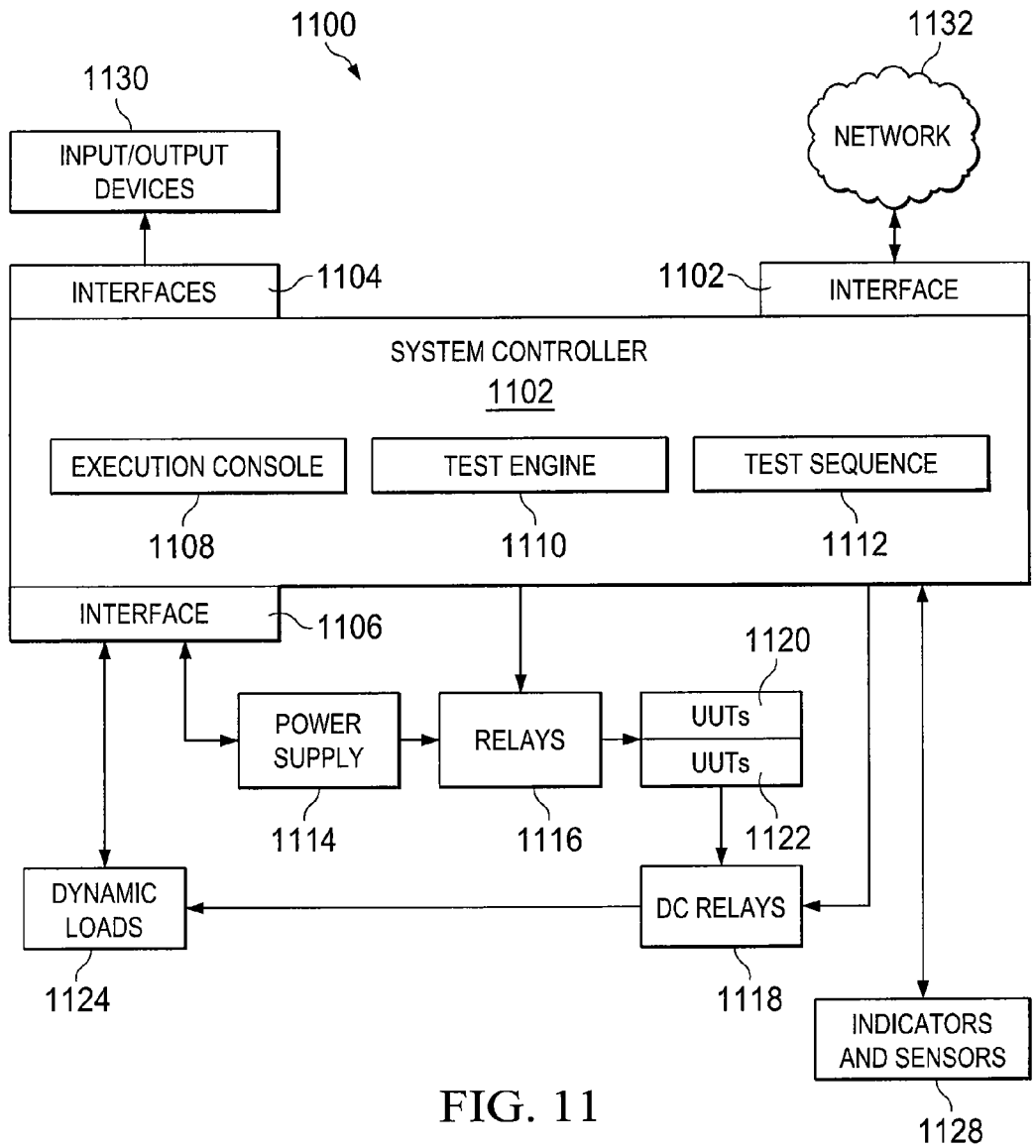
FIG. 11 is a block diagram of a testing system in accordance with an illustrative embodiment.

FIG. 11 is a block diagram of a testing system 1100 in accordance with an illustrative embodiment. In one embodiment, the testing system 1100 may include a system controller 1102 including interfaces 1102, 1104, and 1106 and an execution console 1108, a test executive 1110, and a test sequence set 1112. The testing system 1100 may also include a power supply 1114, relays 1116, DC relays 118, units under test 1120 and 1122, dynamic loads 1124, and indicators and sensors 1128. The execution console 1108, the test engine 1110, and the test sequence 1112 may represent software modules or hardware logic that are further described in FIG. 13.

The interface 1102 is one or more interfaces or ports for communicating with the network 1132. In one embodiment, the network 1132 represents one or more data or communications networks. For example, the network 1132 may be connected to any number of servers, databases, or other networks, for storing, managing, or accessing the results, testing protocols, and parameters utilized by the system controller 1102. For example, testing results from the units under test 1120 and 1122 may be communicated through the network 1132 to one or more remote databases. Another embodiment, the system controller 1102 may include a database for storing power supply, model information, testing parameters, user profiles, test results, and other data and information as are herein described.

In one embodiment, the interface 1102 is a data interface, such as an Ethernet interface communicating with a local area network utilized by a facility or organization. The interfaces 1104 are utilized to communicate with any number of input/output devices 1130. In one embodiment, the system controller 1102 receives commands, user input, data, instructions, and other feedback through the input/output devices 1130. For example, the interfaces 1104 may represent VGA, DVI, USB, Bluetooth, and other standards, ports, and connections. The input/output devices 1130 may represent any number of peripherals utilized to communicate with the system controller 1102. For example, the input/output devices 1130 may include a monitor, a keyboard, and a mouse. However, the number and types of devices that may be utilized as part of the input/output devices 1130 is innumerable.

In one embodiment, the execution console 1108 is a user interface allowing the user to interface with the test engine 1110. In one embodiment, the test engine 1110 is a software engine that performs testing of the units under test 1120, and 1122. For example, the test engine 1110 may execute or implement the test sequence 1112. In one embodiment, the test sequence 1112 is a set of test procedures. The test sequence 1112 may be written in any number of programming languages. For example, each procedure in the test sequence 1112 may be a module or step implemented in LabView to directly control the test instrumentation of the testing system 1100 and indirectly interact with the units under test 1114.

In one embodiment, the system controller 1102 communicates with the power supply 1114 through the interface 1106. For example, the interface 1106 may be a general-purpose interface bus (GPIB). However, the interface 1106 may be any number of ports, interfaces, connectors, buses, cards, or other interfacing components suitable for communicating with other components, instruments, devices, or systems. In one embodiment, the testing system 1100 includes multiple relays, and dynamic loads so that the units under test 1120 and 1122 may be tested and connected/disconnected by a user simultaneously, sequentially, or concurrently. For example, the units under test 1120 and 1122 may represent batches of power supplies, such as 20 units each, that may be connected and tested utilizing the testing system 1100. For example, while the units under test 1120 are being tested, the units under test 1122 may be connected to the test panels and adapters of the testing system 1100. As a result, the testing system 1100 is more effectively utilized at all times and one or more users may effectively manage the testing of numerous power supplies.

In one embodiment, the power supply 1114 is a programmable variable AC source. The power supply 1114 (e.g. Chroma 61605 AC Power Source) may be configured by the system controller 1102 to provide an AC power signal to the units under test 1120 and 1122 through the relays 1116. The relays 1116 are electrically operated switches and may be controlled by the system controller 1102. The testing system 1100 may include AC relays represented by the relays 1116 and DC relays 1118. In one embodiment, the relays 1116 communicate power to the units under test 1120 and 1122. The DC relays 1118 may be integrated with or connected in-line with the dynamic loads 1124. The DC relays 1118 may be configured to share the dynamic loads 1124 between the units under test 1120 and 1122. The AC and DC relays 1116 and 1118 are positioned within the testing system 1100 so that they may be easily replaced based on their anticipated life cycle.

The relays 1116 are configured to detect the presence of one of the units under test 1120 and 1122. For example, if a power supply is not detected at the beginning of the test, one of the relays 1116 will not enable a corresponding test for that position or fixture nest for the duration of the test. In one embodiment, the relays 1116 are configured to detect a short circuit on one of the units under test 1120 and 1122 at start up, or to any time during testing. In addition, each circuit path between the power supply 1114 and corresponding units under test 1120 and 1122 may include a resettable circuit breaker and an internal fuse. The testing system 1100 may also include numerous ground connections between fixtures and components of the testing system 1100 for added safety. The system controller 1102 controls which power supplies are tested utilizing the relays 1116. For example, the system controller 1102 may connect and disconnect the power supply as needed to perform the preset tests. In one embodiment, the power supply 1114 includes a un-interruptible power supply to protect the testing system 1100 from surges or outages.

The power supply 1114 may also be connected to an emergency stop button that is configured to power down the testing system 1100 and corresponding components in response to a user selection. In another embodiment, the emergency stop button or module may cut power to the power supply 1114 that powers the units under test 1120 and 1122, while still powering the rest of the equipment of the testing system 1100. The system controller 1102 may also include or be connected to a number of power supplies to drive the accessories and components of the testing system 1100. For example, two 24 V DC power supplies may drive the system controller 1102, relays, 11, 16 and 1118, and the indicators and sensors 1128.

The dynamic loads 1124 are electronic loads that may be configured for each of the units under test 1120 and 1122. For example, the dynamic loads 1124 (e.g. Chroma 6310/A Series Modular DC Electronic Load) may be configured to provide a DC load for any number of power supplies. The dynamic loads 1124 simulate the load that is typically applied to the units under test 1120 and 1122. The dynamic loads 1124 may be configured to provide other load conditions to the power supplies, such as an open load and a short circuit. The dynamic loads 1124 may measure the voltage and current and provide this information to the system controller 1102 through the interface 1106. The dynamic loads 1124 are configured to measure the output of one or more of the units under test 1120 and 1122 at one time. For example, the dynamic loads 1124 or indicators and sensors 1128 may include a voltmeter, ammeter, oscilloscope, and other devices for measuring the performance and output of one or more of the units under test 1120 and 1122.

The indicators and sensors 1128 are configured to detect the presences of the units under test 1120 and 1122. The indicators and sensors 1128 also indicate whether each of the units under test 1120 and 1122 passed or failed the testing implemented by the testing system 1100 based on the test sequence. For example, the indicators and sensors 1128 may include a number of light emitting diodes (including green, red, and yellow) that indicate whether each of the units under test 1120 and 1122 passed or failed the testing. The testing results and measurements may also be displayed to the user for evaluation and/or concurrently saved internally to the testing system 1100 or to one or more devices available through the network 1132.

The indicators and sensors 1128 may also indicate any errors or performance issues of components of the UUTs 1120 and 1122. In another embodiment, additional indicators and sensors may indicate whether there are any power or temperature spikes related to the equipment of the testing system 1100. The system controller 1102 may include safety logic (not shown) that will automatically power down the testing system 1100 in the event of a power failure or if there is a condition or parameter outside of accepted thresholds. The tests implemented by the system controller 1102 on the UUTs 1120 and 1122 may include UUT startup verification for short circuit on input, UUT voltage output measurement, UUT regulation (vary load 0-90% while measuring output voltage), UUT output short circuit recovery (apply short circuit to output measure time to recover), UUT response, and UUT soak (90% load for 5 minutes) to provide a few examples. The indicators and sensors 1128 may be related to UUT performance, various sensors may monitor the presence of a UUT (at the start of the test), and the indicators show the conditions of the UUT at the end of a test (e.g. red=fail, green=pass, yellow=testing).

Figure 12:
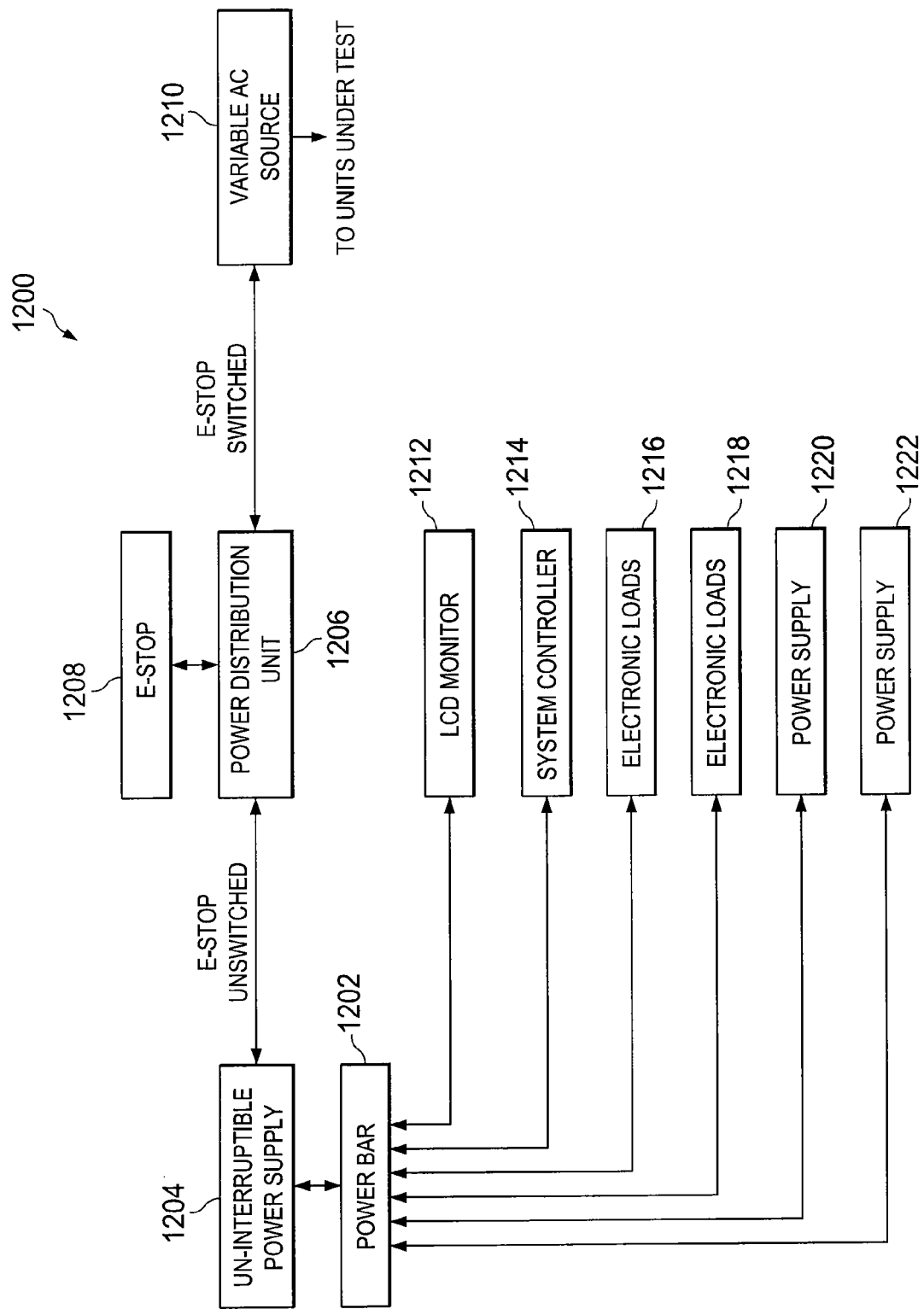
FIG. 12 is a block diagram of a power distribution system of a testing system in accordance with an illustrative embodiment.

FIG. 12 is a block diagram of a power distribution system 1200 of a testing system 1100 in accordance with an illustrative embodiment. The power distribution system 1200 may be the power distributing components and connections of the testing system 1100 of FIG. 11 or may represent a similar embodiment. In one embodiment, the power distribution system 1200 may include a power bar 1202, a un-interruptible power supply 1204, a power distribution unit (PDU) 1206, an electronic stop (E-stop) 1208, a variable AC source 1210, a LCD monitor 1212, a system controller 1214, electronic loads 1216 and 1218, and power supplies 1220 and 1222.

In one embodiment, the power distribution system 1200 powers the testing system utilizing a 3-phase 190-250 V AC supply. The power distribution system 1200 may include an AC unswitched connection to the power distribution unit 1206 and the power bar 1202. The power distribution system 1200 may further include an AC switched connection to the E-stop 1208, the un-interruptible power supply 1204, and accessories of the testing system 1100. In one embodiment, the E-stop 1208 is accessible from the front panel of the testing system 1100. In addition, the E-stop 1208 is monitored by the software of the testing station, such that any activation of the E stop 1208 terminates execution of a test sequence. The E-stop 1208 of the power distribution unit 1206 is configured to cut AC power to the variable AC source 1210 powering units under test while still powering the other equipment of the testing station. The universal power supply 1204 provides power to the LCD monitor 1212, the system controller 1214, the electronic loads 1216 and 1218, and the power supplies 1220 and 1222. In one embodiment, the maximum consumption of amperage is expected to be approximately 20 A per testing tray.

Figure 13:
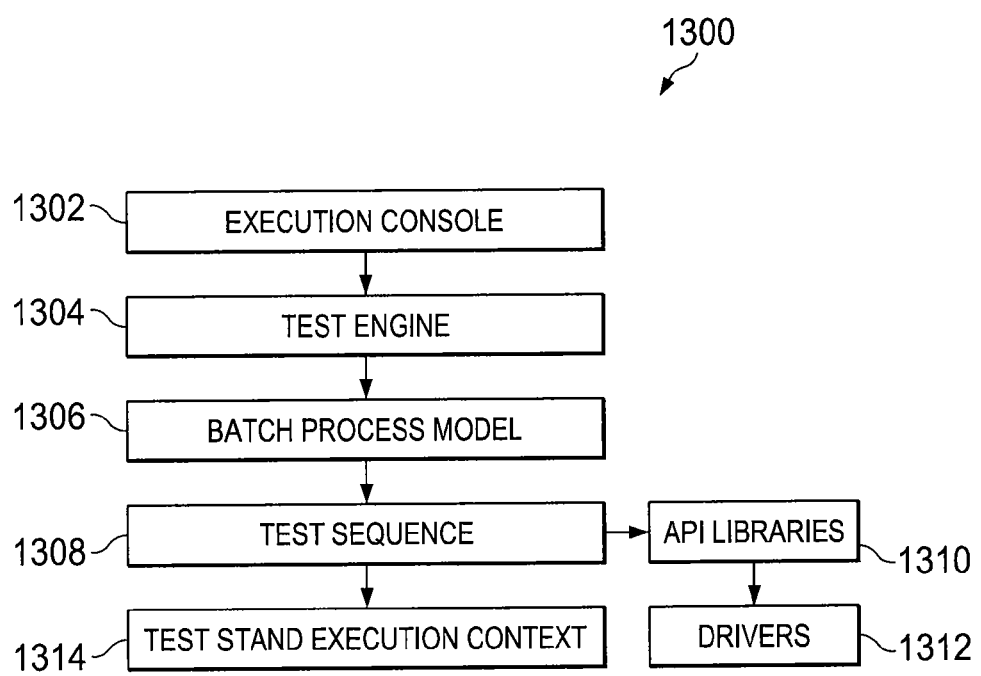
FIG. 13 is a block diagram of software modules of the testing system in accordance with an illustrative embodiment.

FIG. 13 is a block diagram of software modules 1300 of the testing system in accordance with an illustrative embodiment. The software modules 1300 may be stored in one or more memories or data storages and executed by one or more processing units. In another embodiment, the software modules 1300 may be implemented as digital logic or programmable logic, such as an application specific integrated circuit or field programmable gate array.

In one embodiment, the software modules 1300 may include an execution console 1302, a test engine 1304, a batch process model 1306, a test sequence 1308, API libraries 1310, drivers 1312, and test stand execution context 1314. The execution console 1302 is a module configured to provide the user with visibility and control over the execution of the tests. The execution console 1302 may include a graphical user interface that displays information associated with the power supplies (e.g. type, model, identification information, etc), test system status and performance, test status, and test results.

The test engine 1304 is a testing engine that provides the framework for executing the instructions, commands, scripts, and programming that is part of the test sequence 1308. In one embodiment, the batch process model 1306 is a high level process responsible for implementing overhead tasks, such as reporting, monitoring component input/output, and synchronization. The test sequence 1308 are the individual tests performed on the power supplies by the testing system. For example, the test sequences 1308 may include a number of individual modules (e.g. LabVIEW code) that are executed by the testing system to implement and record testing. The test sequence 1308 may access the API libraries 1310 and drivers 1312 to perform the testing. In one embodiment, the API libraries 1310 may include libraries for AC relays, a load switch, a variable AC source, dynamic loads, and fixture input/outputs. The API libraries 1310 may include commercial off-the-shelf libraries and custom libraries developed to optimize communications with the instrumentation of the testing system and power supplies. The drivers 1312 represent hardware drivers responsible for communication with the instruments of the testing system.

In one embodiment, the test sequence 1308 includes an open test, a load test, and a short recovery test that may be performed for one or more designated time periods. The test sequence 1308 may track the time each test is applied. The specific test implemented by the test sequence 1308 may correspond to tests required by a manufacturer, OEM, service provider, repair facility, logistics provider, or other entity. During the test sequence 1308 various voltages, loads, and conditions (e.g. open load, short load, short, max load, minimum load, etc) may be applied. The performance of each power supply is measured and compared against pass/fail thresholds and criteria to determine whether the power supply passed or failed the test sequence 1308. The test sequence may be implemented a single time or multiple times based on the test results. In one embodiment, portions of the test sequence, may be performed multiple times based on a component failure, operator error, system glitch, power outage, or other condition that affects or could affect the test results. In one embodiment, during start-up AC power may be very briefly applied to each unit under test, individually, without a load to monitor to test the units in isolation and for purposes of safety. This test may be performed in sequence. Other tests may be performed sequentially, concurrently (starting or stopping at the same time or at different times), or simultaneously.

Figure 14:
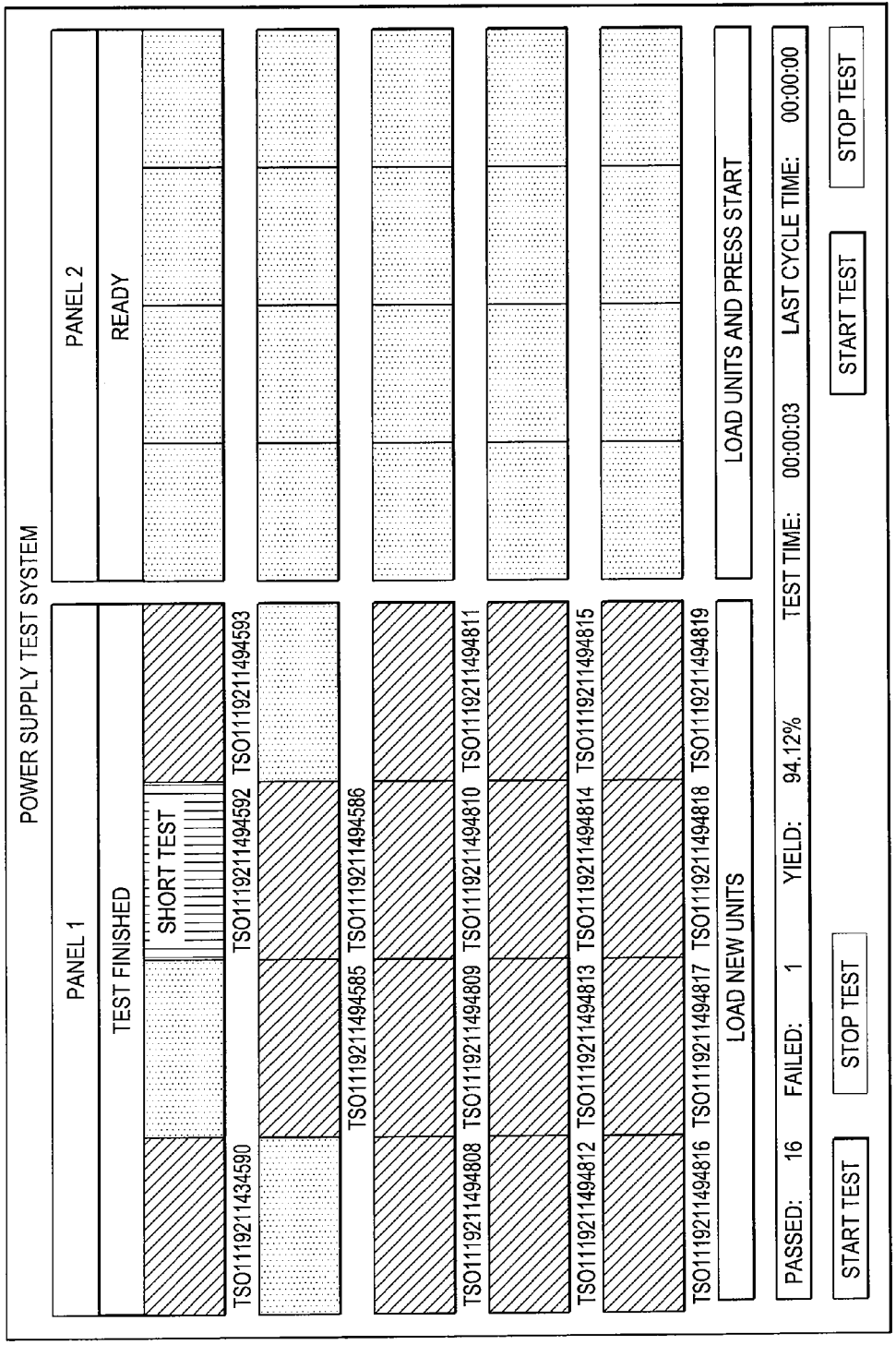
FIG. 14 is a pictorial representation of a graphical user interface 1300 in accordance with an illustrative embodiment.

FIG. 14 is a pictorial representation of a graphical user interface 1400 in accordance with an illustrative embodiment. The graphical user interface 1400 is one embodiment of an interface utilized to display information and receive user input. The graphical user interface 1400 may include identifiers, radio buttons, selectors, icons, hyperlinks, or other interactive elements for interacting with a user. The graphical user interface 1400 may represent any number of windows, views, visual indicators, or screens that are displayed to a user.

The graphical user interface 1400 may also be utilized to authenticate a user by receiving a username and password. For example, different user accounts or profiles may be stored and implemented by the testing system including an operator enabled to execute test sequences, and an administrator that is enabled to manage user accounts and execute test sequences. The user accounts may be assigned to a group that has specific privileges In one embodiment, the graphical user interface 1400 may prompt the user to select a model for the power supply being tested. The model number or type may be scanned or manually entered. The serial number, model number, or type may be utilized to select the test parameters implemented by the testing system. The test panels may also include integrated scanners for automatically determining the model of power supply being tested. The graphical user interface 1400 may also include drop down lists or menus for selecting the power supply utilizing a manufacturer, associated electronic device, or other labeled or known information. For example, the graphical user interface 1400 may include buttons for initiating testing for an associated test panel. Once a first run test button is activated, both run test buttons may be disabled until the test execution is complete or terminated. The user may only be able to select to stop the testing once the testing has been initiated.

In one embodiment, the graphical user interface 1400 may display when the fixture nests of the test panels are loaded and empty and testing information for each power supply being tested. Color coding may be utilized to indicate testing (yellow), passed (green), and failed (red). Colors may also indicate whether the fixture nests are loaded or empty. The graphical user interface 1400 may also display a portion of the test that one or more power supplies failed.

The graphical user interface 1400 may also display an amount of time the tests have been underway, when the tests started, and when the tests are expected to end. The graphical user interface 1400 may also be utilized to control execution of one or more instances of a test sequence, and display the execution status and testing system status in real-time.

The graphical user interface 1400 may also be utilized to enter serial number or other identification for each unit under test (either manually or automatically through scanning), select a product model or type, and abort a test during execution. The functionality and features of the graphical user interface 1400 may be expanded to include new controls, indicators, and information. The graphical user interface 1400 may present a drop down menu, icons and toggle buttons to move through the testing process. For example, the graphical user interface 1400 may present the user a pull-down menu of power supply models to select from. Once selected, a picture of the power supply may be presented to the user for verification. The picture helps the user verify that the right model number is selected and may also be utilized through the testing process including reporting the results of the testing. Pictures may be particularly useful for embodiments configured to test multiple different types of power supplies at once. Once the test is implemented, the testing information associated with the power supply model (e.g. current and voltage rating) may be utilized.

Figure 15:
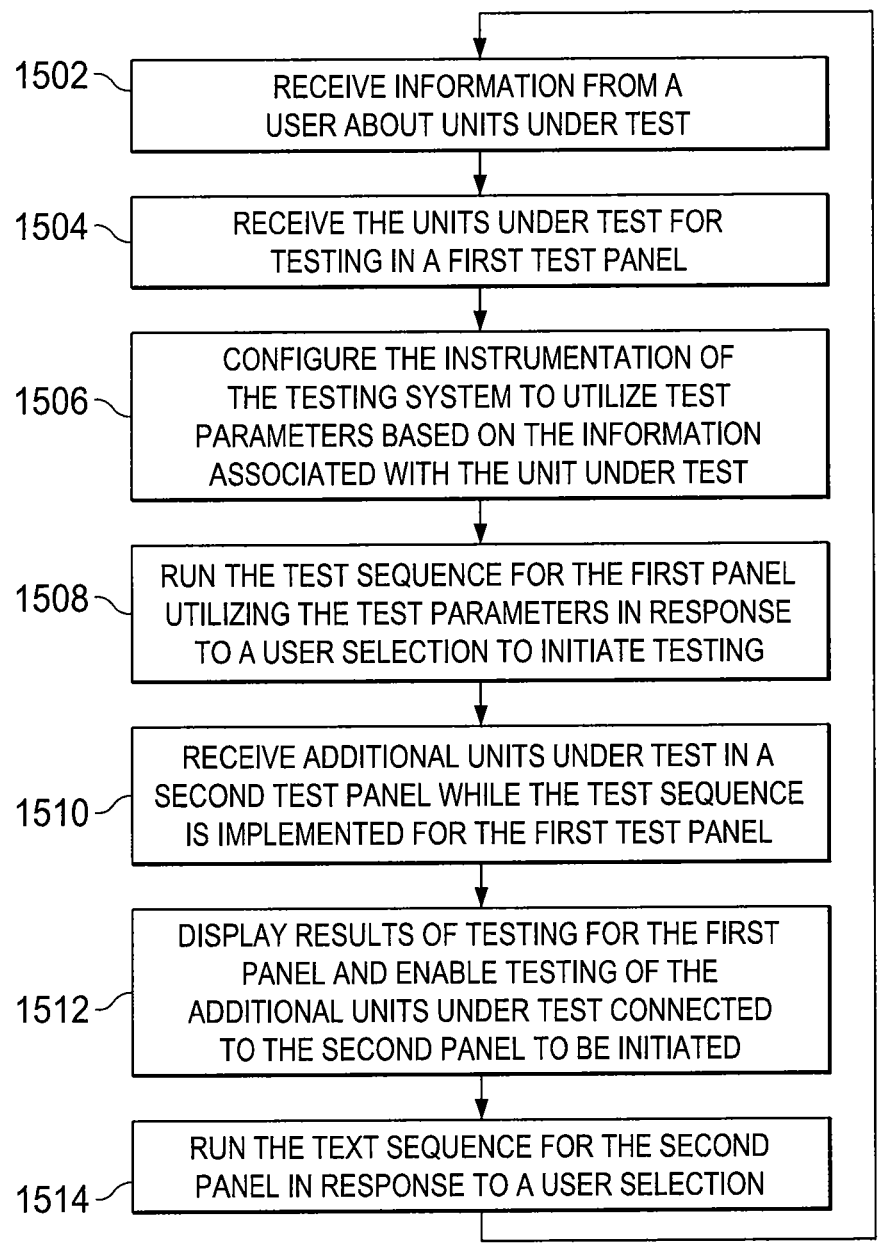
FIG. 15 is a flowchart of a process for processing units under test in accordance with an illustrative embodiment.

FIG. 15 is a flowchart of a process for processing units under test in accordance with an illustrative embodiment. In one embodiment, the process of FIG. 15 may be implemented by a testing system that may be utilized to process numerous units under test simultaneously. The testing system may be managed and controlled by a user or remotely by another user or remote device.

The process of FIG. 15 may begin with the testing system receiving information from a user about units under test (step 1502). The information may identify the model/type of units under test. For example, the information may be received from a serial number, bar code, label, or other information associated with the units under test. The information may be manually entered, scanned, or selected from one or more menus or drop down menus. In one embodiment, the testing is performed for batches of power supplies, chargers, or other electronic devices or accessories. The information may also be scanned by the testing system automatically or based on user guidance.

The testing system receives the units under test in a first test panel (step 1504). During step 1504, the user may connect an AC plug of the unit under test and a DC jack of the unit under test and secure the unit under test for testing. For example, the unit under test and associated cabling may be rested or secured on a tray of the test panel.

Next, the testing system configures the instrumentation of the testing system to utilize test parameters based on the information associated with the units under test (step 1506). During step 1506, the testing system may determine the input voltages, testing sequence, and other test parameters utilized by the testing system as well as expected results and thresholds that indicate whether the units under test passed or failed utilizing the information received from the user in step 1502.

Next, the testing system runs the test sequence for the first panel utilizing the test parameters in response to a user selection to initiate testing (step 1508). The test sequence may be run until finished unless automatically stopped based on an unsafe condition or in response to a user selection to terminate the testing. In one embodiment, access to the first panel is locked during testing so that the process is not improperly interrupted. Once the testing is completed, the first panel is unlocked so that the first panel may be reloaded or reconfigured for testing.

Next, the testing system receives additional units for test in a second test panel while the test sequence is implemented for the first test panel (step 1510). The units under test may be similarly loaded into the testing system. For example, the first and second test panel may include twenty nest fixtures disposed in multiple trays that are configured to connect to twenty different power supplies.

Next, the testing system displays results of testing for the first panel and enables testing of the additional units under test connected to the second panel to be initiated (step 1512). During step 1512, the user may view a display and indicators on the first panel indicating whether each of the units under test passed or failed. In addition, the user may be released to initiate testing through the second panel. Next, the testing system runs the test sequence for the second panel in response to a user selection (step 1514).

The process of FIG. 15 is configured to allow efficient utilization of the testing system and time of the user. For example, the process of FIG. 15 may be implemented repeatedly to load and test the first and second test panels simultaneously.

In one embodiment, the test results may be stored to a database associated with the testing system. The test results may be stored in the form of a report that may be subsequently reviewed or accessed. In one embodiment, the test report may specify a station identification, serial number, date, time, user, execution time, number of results, and pass or fail indicator. The report may also indicate the voltage, current, and response times measured from the unit under test as well as the associated test parameters (including high and low limits) utilized to achieve the test results. The test results may be stored in XML, SQL, or other database or record format known in the art The previous detailed description is of a small number of embodiments for implementing the invention and is not intended to be limiting in scope. The following claims set forth a number of the embodiments of the invention disclosed with greater particularity.

What is claimed:

1. A method for testing a plurality of mobile charging devices that are used to charge a power supply of a mobile device, comprising:
   establishing a connection between a power-end and an adapter-end of each of the plurality of mobile charging devices for connection to a power supply tester;
   automatically configuring a plurality of programmable loads and test parameters of the power supply tester for the plurality of mobile charging devices in response to a user selection of a type of power supply to be tested;
   automatically testing the plurality of mobile charging devices utilizing the test parameters;
   measuring performance characteristics of the plurality of mobile charging devices during testing;
   recording the performance characteristics of each of the plurality of mobile charging devices; and
   displaying results indicating whether each of the plurality of mobile charging devices passed or failed the testing utilizing one or more displays and light emitting diodes of the power supply tester.

2. The method according to claim 1, wherein the power-end is an AC connector, and the adapter-end is a DC connector, and wherein the power supply tester supports a portion of the plurality of mobile charging devices during testing.

3. The method according to claim 1, wherein the user selection is received through an interface of the power supply tester, and wherein the power supply tester provides AC power utilizing a programmable power supply.

4. The method according to claim 1, wherein the power supply tester tests ten or more mobile charging devices of the plurality of mobile charging devices at a time.

5. The method according to claim 1, wherein the testing includes a power test, an open load test, a load test, and a short recovery test.

6. The method according to claim 1, wherein testing comprises enabling an AC relay, enabling a power source output, validating current protection, measuring output voltages, disabling the AC relay, and performing a short circuit test.

7. The method according to claim 1, wherein the performance characteristics are stored in a database and associated with an identifier for each of the plurality of mobile charging devices.

8. The method according to claim 1, wherein the adapter-end of each of the plurality of mobile charging devices are connected to one of a plurality of adapters of the power supply tester.

9. The method according to claim 1, wherein the one or more displays and light emitting diodes display results of the test utilizing a color scheme for a user of the power supply tester.

10. The method according to claim 1, wherein the recording is performed at least every ten seconds for each of the plurality of mobile charging devices.

11. A power supply tester, comprising:
   a plurality of testing modules for testing a plurality of mobile charging devices that are used to charge a power supply of a mobile device, the plurality of testing modules include a set of ports for receiving an adapter-end of each of the plurality of mobile charging devices, a port in communication with the set of ports through one of a plurality of testing circuits, and LEDs indicating whether each of the plurality of mobile charging devices passed or failed the testing, wherein the port is operable to receive a power-end of the plurality of mobile charging devices for providing an alternating current (AC) signal to each of the plurality of mobile charging devices, wherein each of the plurality of testing circuits include a programmable load;
   a programmable power supply for providing the AC signal for the plurality of mobile charging devices being tested;
   one or more measurement devices for measuring performance information through the plurality of test circuits during testing of each of the plurality of mobile charging devices; and
   a display for displaying the performance information to a user indicating whether each of the plurality of mobile charging devices passed or failed the testing.

12. The power supply tester according to claim 11, wherein the plurality of testing circuits perform the testing utilizing test parameters associated with the plurality of mobile charging devices, wherein the test parameters are utilized to configure the programmable load and the programmable power supply.

13. The power supply tester according to claim 12, further comprising:
a user interface for receiving information associated with the plurality of mobile charging devices for setting the test parameters utilized by the plurality of testing circuits.

14. The power supply tester according to claim 11, further comprising:
two or more extensions securing the plurality of testing modules on a first side and a second side of the two or more extensions.

15. The power supply tester according to claim 14, wherein the two or more extensions include ten or more of the plurality of testing modules on the first side and the second side.

16. The power supply tester according to claim 14, wherein the two or more extensions support a wire or body of the plurality of power supply testers.

17. The power supply tester according to claim 14, further comprising:
a database for storing the performance information associated with each of the plurality of mobile charging devices.

18. The power supply tester according to claim 17, wherein the one or more measurement devices measure the performance information of the plurality of mobile charging devices at least every ten seconds.

19. The power supply tester according to claim 14, wherein the two or more extensions are hinged for folding into the power supply tester.

20. The power supply tester according to claim 11, further comprising:
a database in communication with the one or more measurement devices for storing the performance information associated with each of the plurality of mobile charging devices.

21. The power supply tester according to claim 20, wherein performance information is measured by the one or more measurement devices at least every ten seconds for each of the one or more mobile charging devices.

22. The power supply tester according to claim 11, wherein display includes one or more LEDs to indicate whether each of the one or more mobile charging devices passed or failed the testing.

23. A power supply tester, comprising:
a plurality of testing modules for testing a plurality of mobile charging devices that are used to charge a power supply of a mobile device, the plurality of testing modules are integrated with hinged extensions of the power supply tester, the plurality of testing modules include a set of ports for receiving an adapter-end of each of the plurality of mobile charging devices, a port in communication with the set of ports through one of a plurality of testing circuits, and LEDs indicating whether each of the plurality of mobile charging devices passed or failed the testing, wherein the port is operable to receive a power-end of the plurality of mobile charging devices for providing an alternating current (AC) signal to each of the plurality of mobile charging devices, and wherein each of the plurality of testing circuits include a programmable load;
a programmable power supply for providing the AC signal for the plurality of mobile charging devices being tested;
one or more measurement devices for measuring performance information through the plurality of test circuits during testing of each of the plurality of mobile charging devices;
a database for storing the performance information associated with each of the plurality of mobile charging devices; and
a display for displaying the performance information to a user indicating whether each of the plurality of mobile charging devices passed or failed the testing.

24. The power supply tester according to claim 23, wherein the hinged extensions include the plurality of testing modules on a left side and a right side of the hinged extensions.

25. The power supply tester according to claim 23, wherein the one or more measurement devices periodically measure the performance information for each of the plurality of mobile charging devices utilizing a plurality of relays connected to the one or more measurement devices and the plurality of testing circuits.

26. The power supply tester according to claim 23, wherein a first portion of the plurality of mobile charging devices connected to the plurality of testing modules of the left side of hinged extensions are tested while a user connects a second portion of the plurality of mobile charging devices to the plurality of testing modules of the right side of the hinged extensions.

* * * * *